(12) United States Patent
Tan et al.

(10) Patent No.: US 7,408,363 B2
(45) Date of Patent: Aug. 5, 2008

(54) SIGNAL ANALYSIS SYSTEM AND CALIBRATION METHOD FOR PROCESSING ACQUIRES SIGNAL SAMPLES WITH AN ARBITRARY LOAD

(75) Inventors: Kan Tan, Beaverton, OR (US); John J. Pickerd, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 174 days.

(21) Appl. No.: 11/508,697

(22) Filed: Aug. 23, 2006

(65) Prior Publication Data

US 2008/0048674 A1 Feb. 28, 2008

(51) Int. Cl.
*G01R 35/00* (2006.01)
*G01R 27/06* (2006.01)
*G01D 18/00* (2006.01)

(52) U.S. Cl. .................. 324/638; 324/601; 702/85; 702/109

(58) Field of Classification Search ................. 324/601, 324/638
See application file for complete search history.

(56) References Cited

U.S. PATENT DOCUMENTS

| | | | |
|---|---|---|---|
| 2,232,642 A | 2/1941 | Shaw | |
| 3,348,032 A | 10/1967 | Clardy et al. | |
| 3,381,222 A | 4/1968 | Gray | |
| 4,890,062 A | 12/1989 | Haragashira | |
| 5,459,396 A | 10/1995 | Asar | |
| 5,530,373 A | 6/1996 | Gibson et al. | |
| 5,578,932 A | 11/1996 | Adamian | |
| 5,621,331 A | 4/1997 | Smith et al. | |
| 5,734,268 A | 3/1998 | Bockelman | |
| 6,064,312 A | 5/2000 | Weller | |
| 6,105,157 A | 8/2000 | Miller | |
| 6,331,785 B1 | 12/2001 | Swanson et al. | |
| 6,351,112 B1 | 2/2002 | Felps et al. | |
| 6,499,121 B1 | 12/2002 | Roy et al. | |

(Continued)

FOREIGN PATENT DOCUMENTS

EP 0 333 521 A1 9/1989

(Continued)

OTHER PUBLICATIONS

U.S. Office Action, U.S. Appl. No. 11/361,558, filed Feb. 24, 2006, Confirmation No. 5839, Inventor: Kan Tan, Mailing Date Jul. 24, 2007.

(Continued)

*Primary Examiner*—Diego Gutierrez
*Assistant Examiner*—John Zhu
(74) *Attorney, Agent, or Firm*—William K. Bucher

(57) ABSTRACT

A method and apparatus adapted to calibrate a signal path of a signal analysis system such that digital samples acquired by the system are processed for representing an arbitrary impedance loading of the device under test. The method and apparatus calibrates the signal path to characterize transfer parameters of the device under test within a spectral domain. A reflection coefficient ($\Gamma_L$) is defined representative of an arbitrary impedance load coupled to the device under test and an equalization filter is computed to represent the loading of the device under test by the arbitrary impedance. Additional digital samples are acquired using the equalization filter to effect thereby a representation of the arbitrary impedance loading of the device under test.

18 Claims, 11 Drawing Sheets

U.S. PATENT DOCUMENTS

| | | |
|---|---|---|
| 6,501,272 B1 | 12/2002 | Haacke et al. |
| 6,518,744 B1 | 2/2003 | Tallman et al. |
| 6,594,604 B2 | 7/2003 | Metzger et al. |
| 6,606,583 B1 | 8/2003 | Sternberg et al. |
| 6,653,848 B2 | 11/2003 | Adamian et al. |
| 6,725,170 B1 | 4/2004 | Hickman |
| 6,785,625 B1 | 8/2004 | Fan et al. |
| 6,842,012 B2 | 1/2005 | Belge et al. |
| 6,847,213 B2 | 1/2005 | Renken et al. |
| 6,863,564 B2 | 3/2005 | Kreager et al. |
| 6,973,183 B1 | 12/2005 | Garcia |
| 7,076,385 B2 | 7/2006 | Horne et al. |
| 7,098,670 B2 | 8/2006 | Cole |
| 7,173,443 B1 | 2/2007 | Asami |
| 2001/0007091 A1 | 7/2001 | Walter |
| 2002/0007477 A1 | 1/2002 | Hisada et al. |
| 2002/0123853 A1 | 9/2002 | Simon et al. |
| 2003/0001587 A1 | 1/2003 | Arabi |
| 2004/0201383 A1 | 10/2004 | Anderson |
| 2005/0093554 A1 | 5/2005 | Wang et al. |
| 2006/0020410 A1 | 1/2006 | Hsu et al. |
| 2006/0111861 A1 | 5/2006 | Home et al. |
| 2006/0155498 A1 | 7/2006 | Dunsmore et al. |
| 2006/0210022 A1 | 9/2006 | Tan et al. |

FOREIGN PATENT DOCUMENTS

| | | |
|---|---|---|
| EP | 0381398 A2 | 8/1990 |

OTHER PUBLICATIONS

U.S. Office Action, U.S. Appl. No. 11/441,733, filed May 25, 2006, Confirmation No. 1786, Inventor: Kan Tan, Mailing Date Jul. 26, 2007.

U.S. Office Action, U.S. Appl. No. 11/508,394, filed Aug. 23, 2006, Confirmation No. 2341, Inventor: Kan Tan, Mailing Date Aug. 7, 2007.

U.S. Office Action, U.S. Appl. No. 11/441,757, filed May 25, 2006, Confirmation No. 9437, Inventor: Kan Tan, Mailing Date Jul. 19, 2007.

U.S. Office Action, U.S. Appl. No. 11/441,756, filed May 25, 2006, Confirmation No. 9436, Inventor: John J. Pickerd, Mailing Date Jun. 26, 2007.

U.S. Office Action, U.S. Appl. No. 10/786,446, filed Feb. 25, 2004, Confirmation No. 4899, Inventor: John J. Pickerd, Mailing Date Sep. 27, 2007.

U.S. Office Action, U.S. Appl. No. 11/045,413, filed Jan. 27, 2004, Confirmation No. 1776, Inventor: John J. Pickerd, Mailing Date Oct. 11, 2007.

U.S. Office Action, U.S. Appl. No. 11/508,460, filed Aug. 23, 2006, Confirmation No. 2644, Inventor: John J. Pickerd, Mailing Date Sep. 24, 2007.

Godfrey Kwan, "Sensitivity Analysis of One-port Characterized Devices in Vector Network Analyzer," Presented at 2002 NCSL International Workshop and Symposium, pp. 1-11.

Leonard A. Hayden, Vijai K. Tripathi, "Calibration Methods for Time Domain Network Analysis," IEEE Transactions on Microwave Theory and Techniques, V41, N3, 3/93, pp. 415-420.

T. Dhaene, L. Martens, D. De Zutter, "Calibration and Normalization of Time Domain Network Analyzer Measurements," IEEE Transactions on Microwave Theory . . . , Apr. 1994, pp. 580-589.

Application Note, Agilent AN 1287-1, "Understanding the Fundamental Principles of Vector Network Analysis," Aug. 2000, pp. 1-14.

Application Note 1364-1, Agilent Technologies, "De-embedding and Embedding S-Parameter Networks Using a Vector Network Analyzer," Mar. 22, 2001, pp. 1-24.

Application Note, Agilent AN 154, "S-Parameter Design," Nov. 2000, pp. 1-44.

Application Note, Anritsu, Scorpion "Embedding/De-embedding," May 2002, pp. 1-16.

Application Note/5A-017, Maury Microwave Corporation, "LRL Calibration of Vector Network Analyzer," 1999, pp. 1-7.

Jochen Simon, Application Note 1EZ45_0E, Rohde & Schwarz, "Virtual Embedding Networks for Vector Network Analyzer ZVR," Sep. 23, 1998, pp. 1-12.

Application Note, TDA Systems, Inc., "Effects of Measurement Fixtures on S-parameter Compliance Testing of Infiniband Cable Assemblies," 2005, pp. 1-3.

Technical Brief, TDA Systems, Inc., "S-parameters, Insertion and Return Loss Measurements Using TDR Oscilloscope," 2003, pp. 1-3.

Application Note, TDA Systems, Inc., "Choosing Signal Integrity Measurement Tools: Time of Frequency Domain?," Jan. 29, 2002, pp. 1-10.

Application Note, TDA Systems, Inc., "TDR and VNA Measurement Primer," 2004, pp. 1-4.

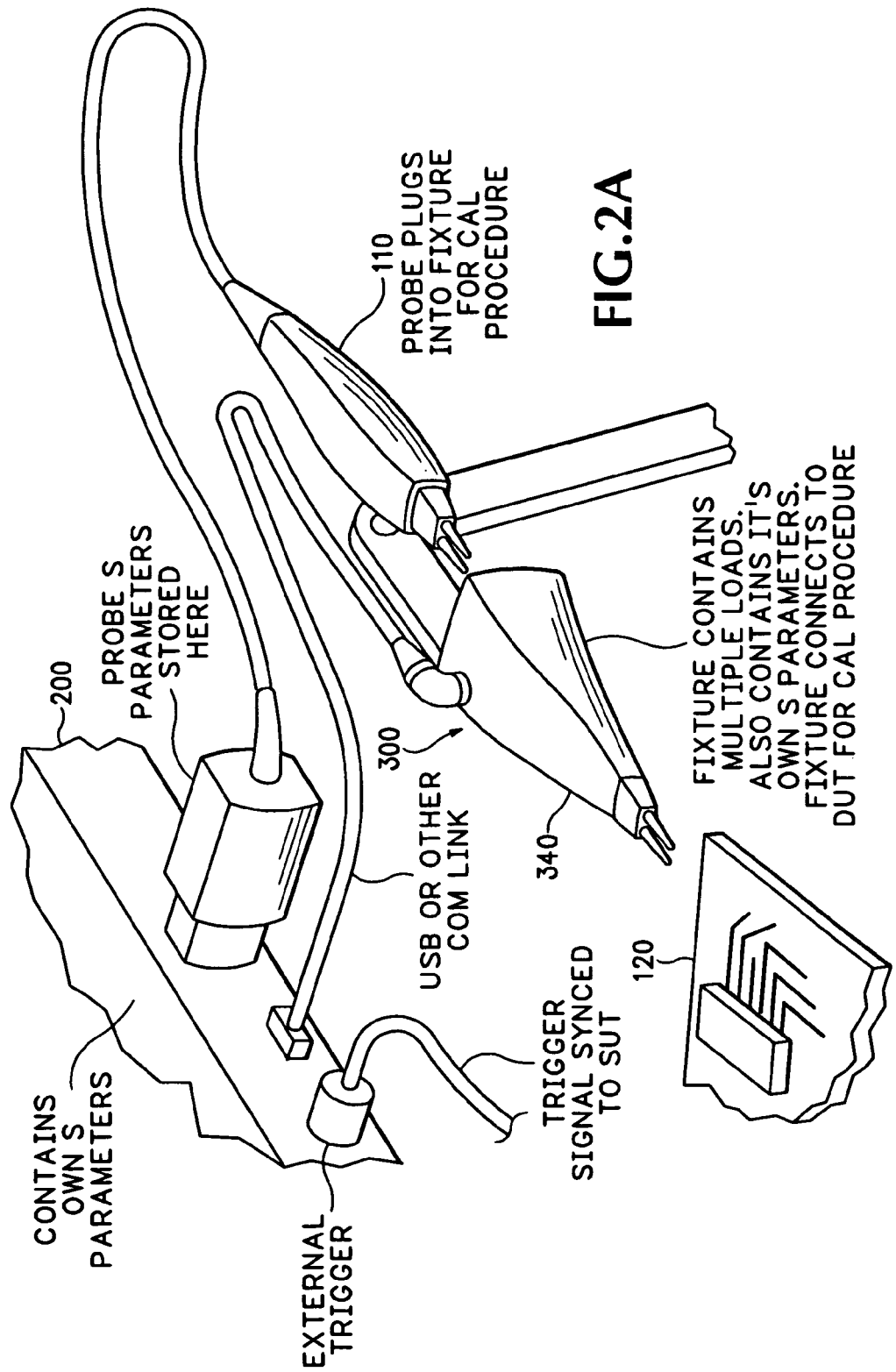

US 7,408,363 B2

SIGNAL ANALYSIS SYSTEM AND CALIBRATION METHOD FOR PROCESSING ACQUIRES SIGNAL SAMPLES WITH AN ARBITRARY LOAD

FIELD OF THE INVENTION

The invention relates generally to signal analysis systems and, more particularly, to a system, apparatus and method for processing acquired digital samples of a test signal from device under test for producing digital samples representing an arbitrary impedance loading of the device under test.

BACKGROUND OF THE INVENTION

Typical probes used for signal acquisition and analysis devices such as digital storage oscilloscopes (DSOs) and the like have an impedance associated with them which varies with frequency. For example, a typical probe may have an impedance of 100K to 200K Ohms at DC, which impedance drops towards 200 ohms at 1.5 GHz. Higher bandwidth probes drop to even lower impedance values. This drop in impedance as frequency increases, coupled with the fact that many circuits being probed have a relatively low output impedance in the range of 25-150 ohms, results in a significant loading of the circuit under test by the probe. As such, an acquired waveform received via a probe loading such a circuit may not accurately represent the voltage of the circuit prior to the introduction of the probe.

There is also a further need to process acquired samples of a signal from a device under test to produce digital samples representing an arbitrary load on the device under test. Such a capability in a signal analysis system would allow a user to observe the effects of various loads on an output signal from the device under test.

SUMMARY OF INVENTION

These and other deficiencies of the prior art are addressed by the present invention of a system, apparatus and method for processing acquired digital samples of a signal under test from a device under test for producing digital samples representing an arbitrary impedance loading of the device under test. Briefly, the invention provides a method calibrating a signal path of a signal analysis system having a device under test by characterizing transfer parameters of the device under test within a spectral domain. Arbitrary impedance load voltages are computed using the characterized transfer parameters and a defined reflection coefficient representative of an arbitrary impedance load coupled to the device under test. An equalization filter is computed using the computed arbitrary impedance load voltages and a spectral domain representation of acquired samples of the signal under test during the calibration of the signal path with the equalization filter adapted to represent the loading of the device under test by the arbitrary impedance load. The equalization filter may be implemented in the frequency domain or the time domain. The signal from the device under test is passed through the equalization filter in either the frequency domain or the time domain with the frequency domain representation being transformed to the time domain. As a result, the user will see a time domain display that represents the signal in a circuit under test as it would appear with the arbitrary loading.

Specifically, a signal analysis system according to one embodiment of the invention has a digitizing instrument having a memory for storing transfer parameters associated with the digitizing instrument and generating digital samples of a signal under test. A test probe provides the signal under test from a device under test to the digitizing instrument. The test probe has a memory for storing transfer parameters associated with the probe. A controllable impedance device having selectable impedance loads is selectively coupled to the device under test. A controller having associated memory is coupled to receive the digital samples of the signal under test and communicates with the digitizing instrument and the test probe for selectively coupling impedance loads in the controllable impedance device to the device under test. The acquired time domain digital samples of the signal under test are converted to a spectral domain representation for each selected impedance load by the controller and the transfer parameters of the device under test within a spectral domain are characterized from the spectral domain representations for each selected impedance load. The controller computes an equalization filter using the characterized transfer parameters of the device under test and a reflection coefficient representative of an arbitrary impedance load coupled to the device under test.

The objects, advantages and novel features of the present invention are apparent from the following detailed description when read in conjunction with appended claims and attached drawings.

BRIEF DESCRIPTION OF THE DRAWINGS

The teachings of the present invention can be readily understood by considering the following detailed description in conjunction with the accompanying drawings, in which:

FIG. 2A illustrates one embodiment of the present invention;

To facilitate understanding, identical reference numerals have been used, where possible, to designate identical elements that are common to the figures.

DETAILED DESCRIPTION OF THE INVENTION

Figure 1:
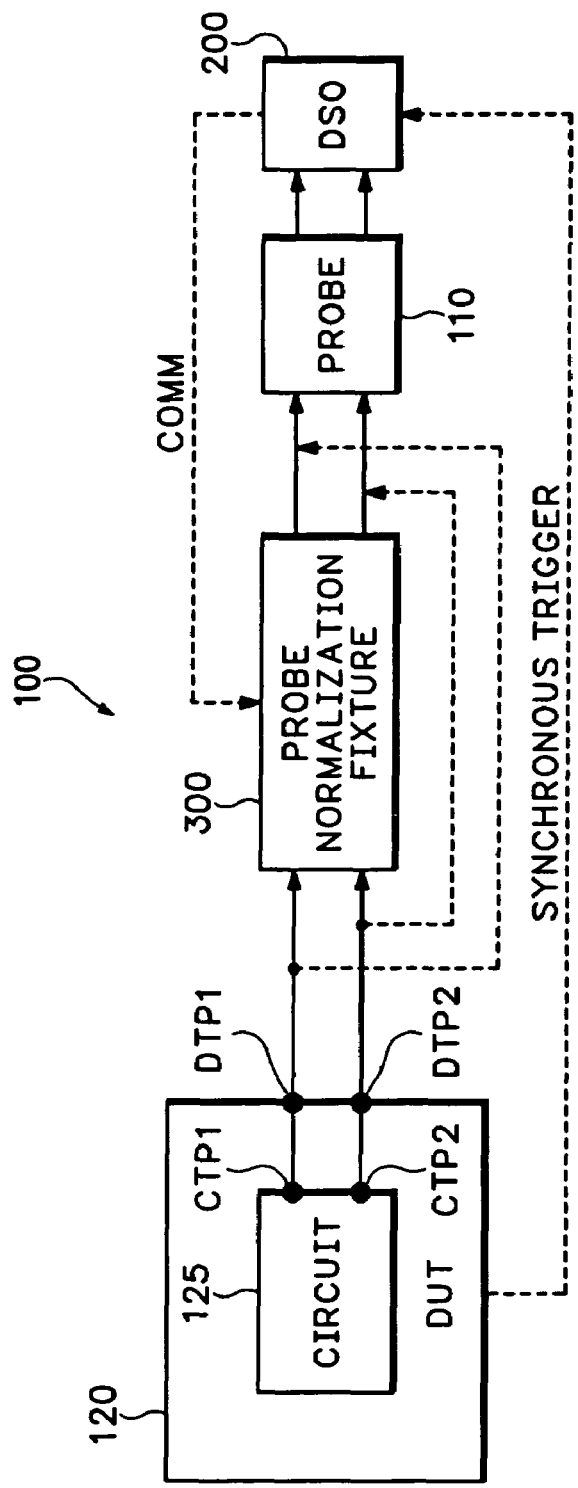
FIG. 1 depicts a high level block diagram of a signal analysis system including a device under test arranged in accordance with an embodiment of the present invention.

FIG. 1 depicts a high level block diagram of a signal analysis testing system 100 including a device under test arranged in accordance with various embodiments of the present invention. Specifically, a probe 110 is operably coupled to a signal analysis device such as a digital storage oscilloscope (DSO) 200 to provide thereto a signal under test (SUT) received from a device under test (DUT) 120. A probe normalization fixture 300 is selectively interposed between the DUT 120 and probe 110.

The invention operates to determine transfer parameters of a device under test in a signal path during the calibration of the signal path including the probe 110 and, optionally, DSO input channel. The calibration removes (i.e., de-embed) the signal degrading effects of elements in the signal path from the measurement of the DUT (or circuit) including transmission errors in the system. This de-embedding process is conducted by characterizing the probe 110 and other elements using a two-port S parameter or T parameter representation, which representation may be used to adjust impedance normalization parameters within the probe normalization fixture 300 and/or filter parameters used to process an acquired sample stream within the DSO 200.

The invention utilizes a two-port matrix of S parameters or T parameters to model each element associated with the measurement signal path. Optionally, some elements are not modeled. The T parameters are used so that a two-port matrix for each of the elements of the system model may be computed in a straight forward manner by multiplying them in the order they occur in the signal path. T parameters are transfer parameters and are derived from S parameters. In various embodiments, the invention provides a new method determining transfer parameters of a device under test and computing an equalization filter adapted to represent the loading of the device under test by the arbitrary impedance load.

T parameters for the normalization fixture 300 and/or probe 110 may be stored in the fixture 300 itself, the probe 110 or the DSO 200. In one embodiment, T parameters for the probe 110 are stored in the probe while T parameters for the fixture 300 are stored in the fixture. The scope channel T parameters are optionally stored in the DSO 200.

The signal provided by the DUT 120 is used as the signal source for a calibration procedure. In the calibration mode, measurement acquisitions are made by the DOS 200 of the signal under test under various impedance load conditions. In one embodiment, the signal path for the SUT passes through the probe normalization fixture 300 for both the calibration mode and non-calibration mode of operation. This allows for an automated one button press calibration procedure. In a manual calibration embodiment, the SUT is directly coupled from the DUT 120 to the probe 110 for a portion of the calibration mode and indirectly coupled through the probe normalization fixture 300 for the rest of the calibration mode. In this embodiment, the probe normalization fixture 300 may be excluded from the signal path and the probe 110 may be directly coupled to the DUT 120 in the non-calibration mode of operation. The unbroken line indicates the signal path through the probe normalization fixture 300 and the dotted lined indicates the direct signal path between the DUT 120 and the probe 110. It will be noted that the probe paths depicted in FIG. 1 comprise two probe paths such as used within the context of a differential probe. In alternate embodiments, a single-ended or non-differential probe is used in which a first path passes a signal under test while a second path is operatively coupled to a common or ground point.

Generally speaking, the calibration procedure enables characterization of the DUT 120 using the SUT from the DUT 120 and switchable or selectable impedance loads in the probe normalization fixture 300 such that an equalization filter may be computed. The equalization filter may be implemented in either the time domain or the frequency domain to be described in greater detail below. The equalization filter is used to process the acquired samples from the DUT in the non-calibration mode such that signal degradation or artifacts imparted to the SUT provided by the DUT are compensated for within the system 100, effectively de-embedding the loading of the DUT by the signal analysis system 100 and transmission errors within the signal path of the signal analysis system 100. If the relative time constants between the DUT 120 and the selectable loads in the normalization test fixture 300 are small, then the group delay of the signal under test has a minimal effect on the accuracy of the computed equalization filter when triggering the DSO 200 with the signal under test. In other cases, a synchronous trigger signal isolated from the SUT is preferably provided to a external trigger input of the DSO 200 from the DUT 120. The synchronous trigger signal assures that the DSO receives a trigger signal that is not affected by group delays of the SUT during calibration. The synchronous trigger signal may also be generated by an external trigger source that is synchronous with the SUT.

The (illustratively two) probe paths are coupled to the DUT 120 at a first device test point DTP1 and a second device test point DTP2. Optionally, internal to the DUT 120 is a circuit 125. The circuit 125 includes a first circuit test point CTP1 and a second circuit test point CTP2, where CTP1 is coupled to DTP1 and CTP2 is coupled to DTP2. For example, the DUT 120 may comprise an integrated circuit (IC) having a plurality of pins including pins associated with the test points DTP1 and DTP2, while a die within the IC includes the circuit test points CTP1 and CTP2. The difference in these tests points and the characterization of the operating parameters associated with these test points will be discussed in more detail below with respect to FIG. 5.

Optionally, a user may insert a mathematical model such as a two-port S parameter or T parameter representation into the signal measurement path to compensate for signal degradations or characteristics between the scope probe tip and the specific measurement point of a device under test. In this manner, an integrated circuit (IC) may be probed at its respective test point to provide, with mathematical compensation of the signal path between the test points (e.g., DTP1, DPT2) and the die interface (e.g., CTP1, CTP2), a voltage or signal for analysis that accurately represents the signal at the die itself. Generally speaking, the invention may utilize transfer parameters received from, e.g., the user that characterize a circuit between the test probe 110 and the DUT 120 such that the calculations of an equalization filter adapted to represent the loading of the device under test by the arbitrary impedance load. Such insertion of additional transfer parameters is also useful in determining the effect of different intermediate circuitry (i.e., between a DUT or DUT portion and test probe) such as different die layout, packaging, DUT output circuitry and the like.

FIG. 2A illustrates an example of the signal analysis system 100 implementing the calibration procedure to be described in greater detail below. Specifically, FIG. 2A graphically illustrates an embodiment of the invention wherein the DSO 200 (optionally storing S parameters and/or T parameters) is operatively coupled to the probe 110. The DSO 200 may be coupled to receive a trigger signal synchronized to the SUT via a external trigger input jack. The probe 110 optionally stores S parameters and/or T parameters in, for example, a non-volatile memory within the probe connector housing. The probe normalization fixture 300 containing multiple loads and/or an impedance matrix to be described in greater detail below is configured as a probe tip fixture 340 adapted to receive the probe. The probe tip fixture 340 is also adapted to receive a communication link from the DSO 200. The probe tip fixture 340 optionally stores its own S parameters and/or T parameters. The probe tip fixture 340 preferably includes two probing tips adapted to electrically probe the DUT 120 with the probing tips adapted for either differential signal probing or single ended signal probing with an associated ground. It should be noted that the separate communication link cable between the probe tip fixture 340 and the DSO 200 shown in FIG. 2A may be integrated with the probe cable. It should also be noted that the function of the probe tip fixture 340 may be included within the probe 110.

The probe tip fixture 340 may be a stand alone unit or incorporated within the probe 110. Generally speaking, the probe tip fixture 340 comprises a set of input probe pins adapted for connection to the DUT 120 and a set of output probe pins adapted for connection to the probe 110. In the case of the probe tip fixture 340 being included within the probe 110, an electronic or mechanical selection means may be employed within the probe 110 to facilitate inclusion or exclusion of the probe tip fixture function from the circuit path between the DUT 120 and probe 110.

In the automated calibration embodiment, the probe normalization fixture 300 comprises the probe tip fixture 340 that is inserted between the test probe 110 and a device under test (DUT) 120 and used during a one button press calibration procedure. This calibration procedure uses no external voltage sources, only the signal under test provided by the device under test. The probe tip fixture 340 contains multiple impedance loads (resistive and/or reactive impedances) and optionally by-pass impedance loads that are selected based on the probe 110 and in response to the device under test or signal produced by the device under test. The multiple impedance loads comprise series, parallel and/or series/parallel combinations of resistive, capacitive and/or inductive elements. The multiple impedance loads may be passive or active and may be selected using relays, solid state switching devices, or other selecting means. In the two-port network model to be described in greater detail below, the impedance loads are symmetric for differential SUTs from the device under test 120. Impedance load symmetry is necessary to suppress any common modes in the differential signal. The multiple impedance loads may be arranged as a load or impedance matrix. The multiple impedance loads may be inserted into the signal path parallel to the DUT and probe inputs or in series with the DUT and probe inputs. The by-pass impedance loads directly couple the signal under test to the probe inputs. One of the by-pass impedance loads represent an open parallel condition where no multiple impedance loads are inserted into the signal path parallel to the DUT and probe inputs. The other by-pass impedance load represents a shorted series condition where no multiple impedance loads are inserted in series with the DUT and probe inputs. The probe tip fixture 340 may comprise a stand-alone unit adapted to receive the probe 110 or may be incorporated into the probe itself.

The probe tip fixture 340 may also be used in a first implementation of the manual calibration embodiment. In this implementation, a direct signal path between the DUT 120 and the probe 110 is provided for the signal under test for a portion of the calibration mode and then the probe tip fixture 340 is inserted into the signal path for the rest of the calibration mode. As with the automated embodiment, this calibration procedure uses no external voltage sources, only the signal under test provided by the device under test. Selected impedance loads from the multiple impedance loads are inserted into the signal path during calibration. In this implementation, the probe tip fixture 340 may be removed from the signal path after the calibration mode and the probe 110 directly coupled to the calibrated test point.

Figure 2B:
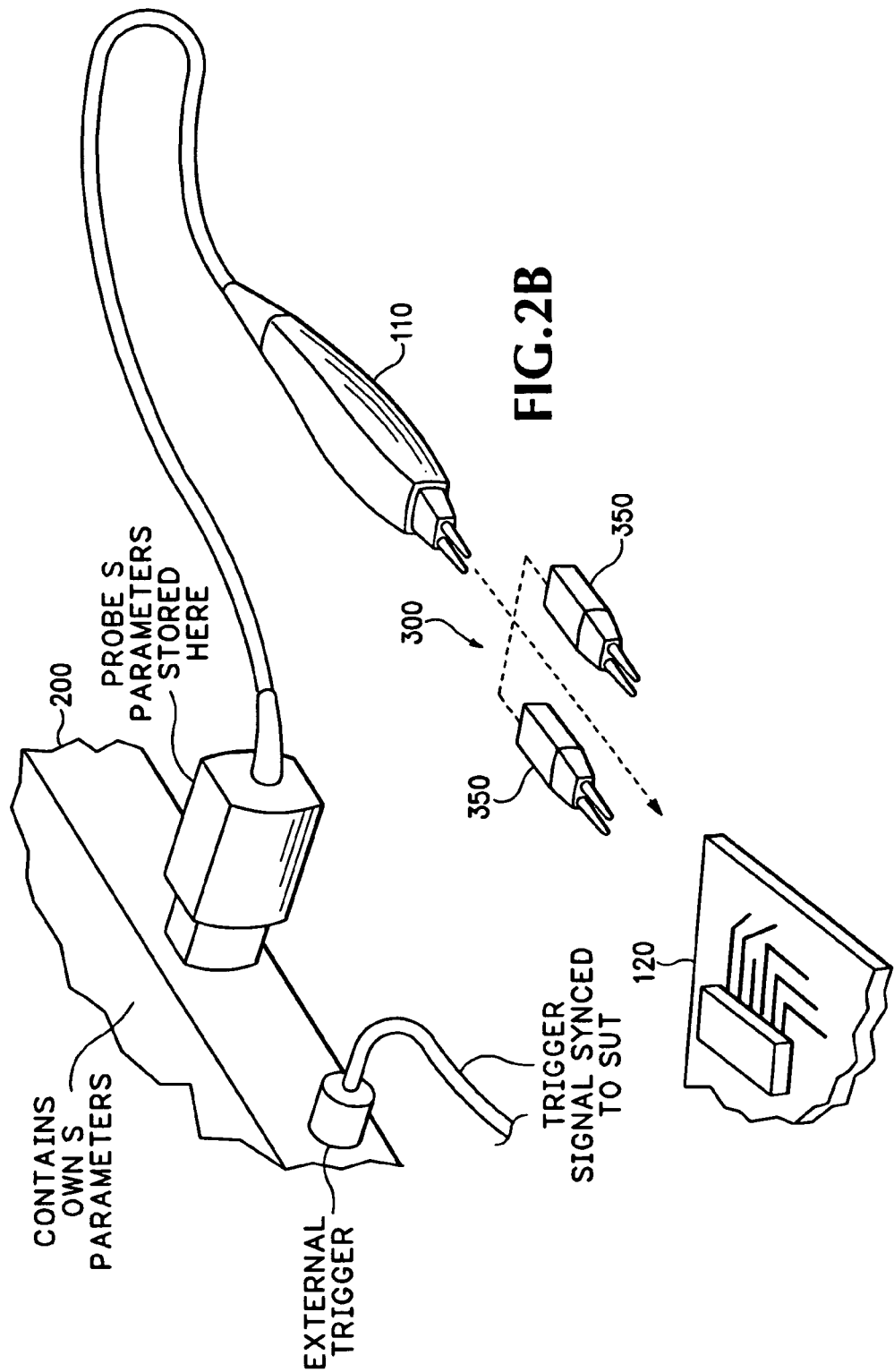
FIG. 2B illustrates a further embodiment of the present invention.

FIG. 2B illustrates further manual calibration embodiment where the probe normalization fixture 300 may be implemented as probe load adapters 350 that are inserted between the test probe 110 and a device under test (DUT) 120. Each probe load adapter 350 has an impedance load and preferably two probing tips adapted to electrically probe the DUT 120 with the probing tips adapted for either differential signal probing or single ended signal probing with an associated ground The probe load adapter 250 further has an electrical contacts for electrically coupling the probing tips of the adapter 350 to the probing tips of the test probe 110. As with the multiple impedance loads in the probe tip fixture 340, the impedance load in each probe load adapter 350 comprise symmetric series, parallel and/or series/parallel combinations of resistive, capacitive and/or inductive elements. The impedance load may be inserted into the signal path parallel to the DUT and probe inputs or in series with the DUT and probe inputs. In this implementation of the manual calibration embodiment, the test probe 110 is directly coupled to a DUT test point providing a direct signal path between the DUT 120 and the probe 110 for the signal under test from which a plurality of samples of the signal under test are acquired. A probe load adapter 350 having a selected impedance load is coupled to the test probe 110 and is inserted into the signal path. A plurality of samples of the signal under test are acquired with the impedance load in the signal path. Additional probe load adapters 350 may be coupled to the test probe and inserted into the signal path for the acquisition of addition samples of the signal under test. As with the automated embodiment, this manual calibration procedure uses no external voltage sources, only the signal under test provided by the device under test. In this implementation, the probe load adapter 350 may be removed from the signal path after the calibration mode and the probe 110 directly coupled to the calibrated test point.

The relationship between S and T parameters will now be briefly discussed. It should be noted that while T parameters are primarily described within the context of the invention, the use of S parameters instead of T parameters is also contemplated by the inventors. Thus, S parameters may be substituted wherever the storage and/or use of T parameters is discussed herein. T parameters may be computed from the S parameters at the time the algorithms are processed. The relationship between T and S parameters is given by equations 1 and 2 below:

$$\begin{pmatrix} T_{11} & T_{12} \\ T_{21} & T_{22} \end{pmatrix} = \begin{pmatrix} -\frac{S_{11}S_{22} - S_{12}S_{21}}{S_{21}} & \frac{S_{11}}{S_{12}} \\ -\frac{S_{22}}{S_{21}} & \frac{1}{S_{21}} \end{pmatrix} \quad (EQ\ 1)$$

$$\begin{pmatrix} S_{11} & S_{12} \\ S_{21} & S_{22} \end{pmatrix} = \begin{pmatrix} \frac{T_{12}}{T_{22}} & \frac{T_{11} \cdot T_{22} - T_{12} \cdot T_{21}}{T_{22}} \\ \frac{1}{T_{22}} & \frac{-T_{21}}{T_{22}} \end{pmatrix} \quad (EQ\ 2)$$

Figure 3:
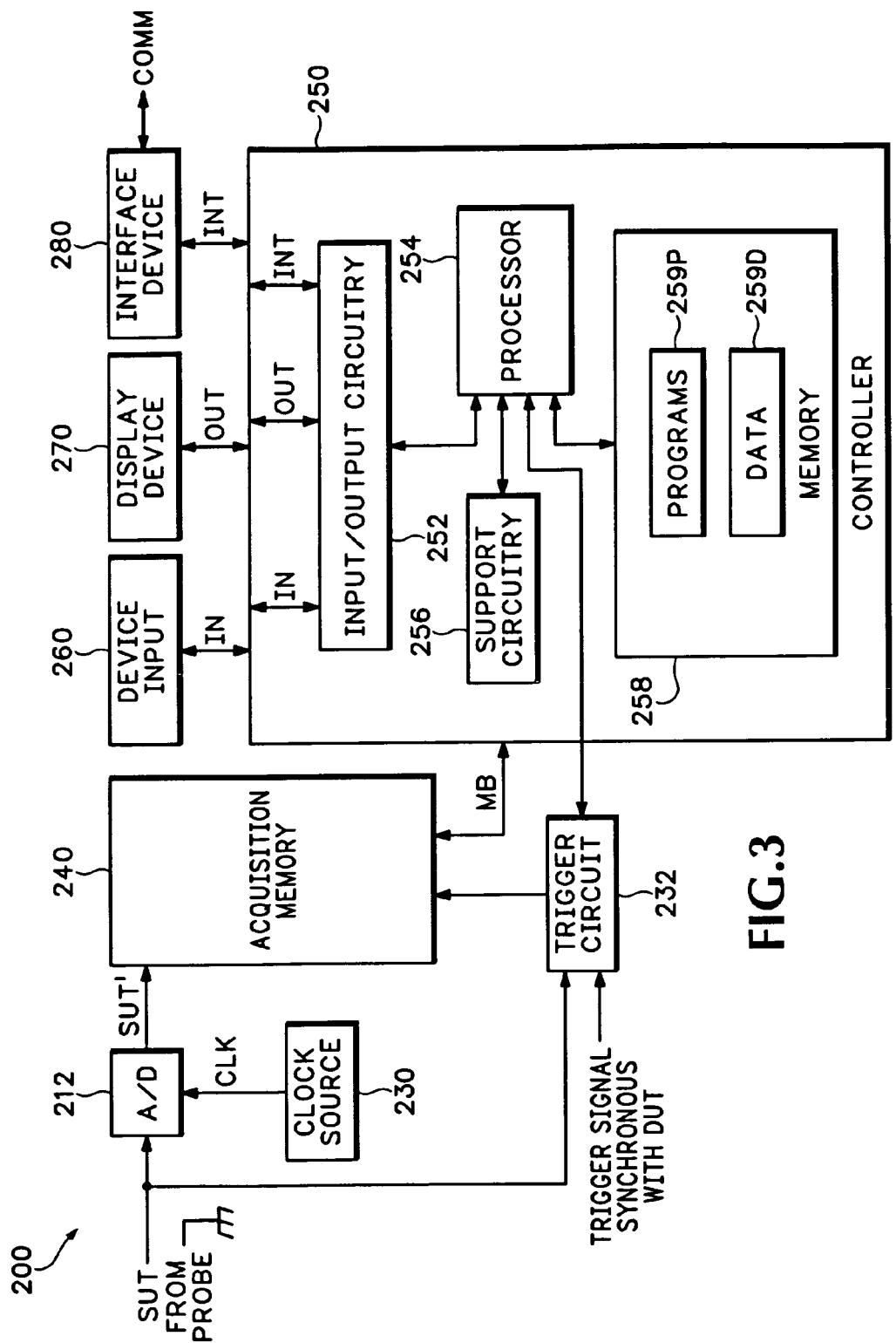
FIG. 3 depicts a high level block diagram of a digital storage oscilloscope.

FIG. 3 depicts a high level block diagram of a digital storage oscilloscope (DSO) 200 suitable for use with the signal analysis system 100. Specifically, the DSO 200 comprises an analog to digital (A/D) converter 212, a clock source 230, a trigger circuit 232, an acquisition memory 240, a controller 250, an input device 260, a display device 270 and an interface device 280. The SUT is provided to the A/D converter 212 and the trigger circuit 232. The trigger circuit 232 may also receive an external trigger signal synchronous with the SUT. The A/D converter 212 receives and digitizes a SUT in response to a clock signal CLK produced by the clock source 230. The clock signal CLK is preferably a clock signal adapted to cause the A/D converter 212 to operate at a maximum sampling rate, though other sampling rates may be selected. The clock source 230 is optionally responsive to a clock control signal CC (not shown) produced by the controller 250 to change frequency and/or pulse width parameters associated with the clock signal CLK. It is noted that the A/D converter 212 receives the SUT via a probe (not shown), which probe may comprise a differential probe or a single ended (i.e., non-differential) probe.

A digitized output signal SUT' produced by the A/D converter 212 is stored in the acquisition memory 240. The acquisition memory 240 cooperates with the controller 250 to store the data samples provided by the A/D converter 212 in a controlled manner such that the samples from the A/D converter 212 may be provided to the controller 250 for further processing and/or analysis.

The controller 250 is used to manage the various operations of the DSO 200. The controller 250 performs various processing and analysis operations on the data samples stored within the acquisition memory 240. The controller 250 receives user commands via an input device 260, illustratively a keypad or pointing device. The controller 250 provides image-related data to a display device 270, illustratively a cathode ray tube (CRT), liquid crystal display (LCD) or other display device. The controller 250 optionally communicates with a communications link COMM, such as a general purpose interface bus (GPIB), Internet protocol (IP), Ethernet or other communications link via the interface device 280. It is noted that the interface device 280 is selected according to the particular communications network used. An embodiment of the controller 250 will be described in more detail below.

The signal analysis device 200 is set-up by user commands from the input device 260 that establishes a trigger threshold and pre and post trigger times for the storing of the digital samples from the A/D converter 212. The digital samples are initially stored in a circular buffer in the acquisition memory. The circular buffer continuously stores digital samples from the A/D converter 212 with new digital samples overwriting older digital samples once the circular buffer is full. The trigger circuit 232 generates a trigger output to the acquisition memory upon the signal under test crossing the trigger threshold to stop the storing of digital samples in the circular buffer after the post trigger time. If the DSO is triggering off of the synchronous trigger signal, the trigger circuit generates a trigger output to the acquisition memory upon the synchronous trigger signal crossing the trigger threshold to stop the storing of digital samples in the circular buffer after the post trigger time. The contents of the circular buffer are stored as a waveform record within the acquisition memory 240.

The DSO 200 of FIG. 3 is depicted as receiving only one SUT. However, it will be appreciated by those skilled in the art that many SUTs may be received and processed by the DSO 200. Each SUT is preferably processed using a respective A/D converter 212, which respective A/D converter may be clocked using the clock signal CLK provided by a common or respective clock source 230 or some other clock source. Each of the additional digitized SUTs is coupled to the acquisition memory 240 or additional acquisition memory (not shown). Any additional acquisition memory communicates with the controller 250, either directly or indirectly through an additional processing element.

The controller 250 comprises a processor 254 as well as memory 258 for storing various programs 259P (e.g., calibration routines) and data 259D (e.g., T and/or S parameters associated with one or more components within the testing system). The processor 254 cooperates with conventional support circuitry 256 such as power supplies, clock circuits, cache memory and the like, as well as circuits that assist in executing the software routines stored in the memory 258. As such, it is contemplated that some of the process steps discussed herein as software processes may be implemented within hardware, for example as circuitry that cooperates with the processor 254 to perform various steps. The controller 250 also contains input/output (I/O) circuitry 252 that forms an interface between the various functional elements communicating with the controller 250. For example, the controller 250 communicates with the input device 260 via a signal path IN, a display device 270 via a signal path OUT, the interface device 280 via a signal path INT and the acquisition memory 240 via signal path MB. The controller 250 may also communicate with additional functional elements (not shown), such as those described herein as relating to additional channels, SUT processing circuitry, switches, decimators and the like. It is noted that the memory 258 of the controller 250 may be included within the acquisition memory 240, that the acquisition memory 240 may be included within the memory 258 of the controller 250, or that a shared memory arrangement may be provided.

Although the controller 250 is depicted as a general purpose computer that is programmed to perform various control functions in accordance with the present invention, the invention can be implemented in hardware as, for example, an application specific integrated circuit (ASIC). As such, the process steps described herein are intended to be broadly interpreted as being equivalently performed by software, hardware or a combination thereof.

Figure 4:
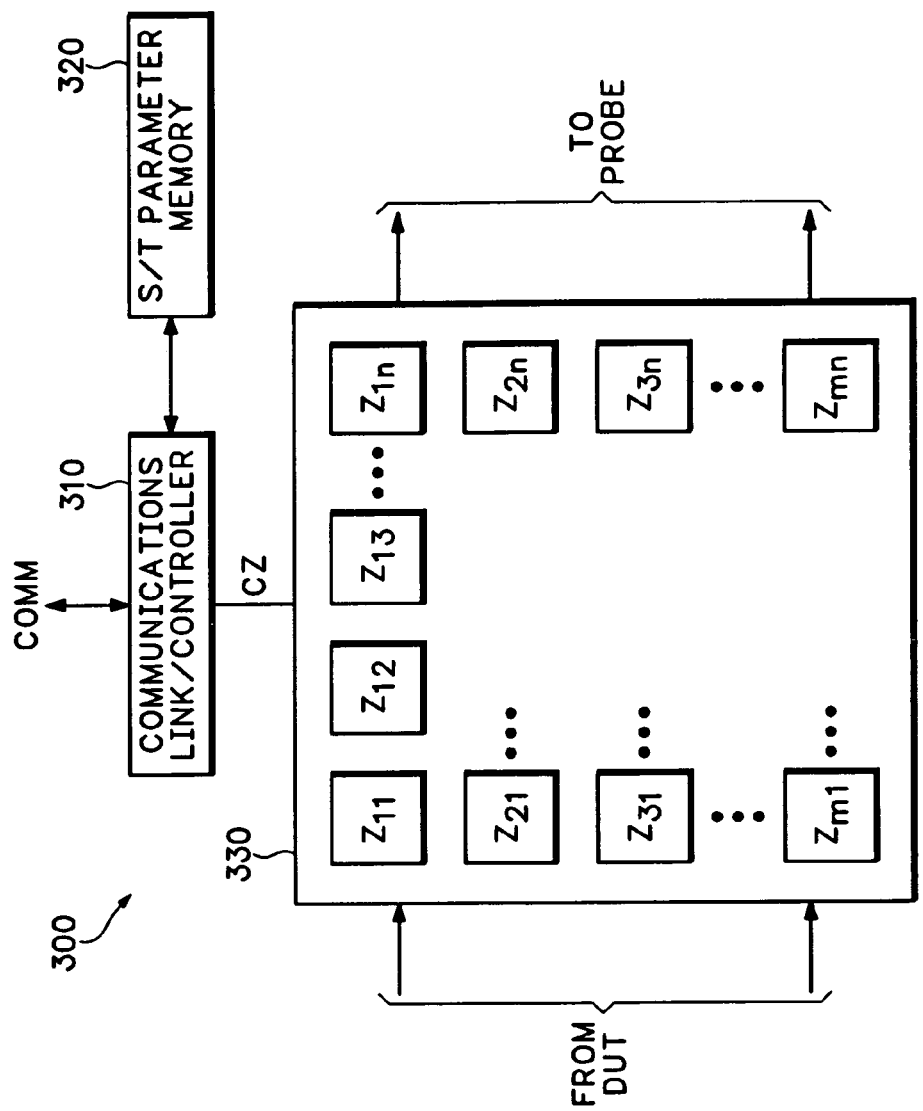
FIG. 4 depicts a high level block diagram of a probe normalization fixture suitable for use in the system of FIG. 1.

FIG. 4 depicts a high level block diagram of a probe tip fixture 340 suitable for use in the signal acquisition system 100. Specifically, the probe tip fixture 340 of FIG. 4 comprises a communication link/controller 310, an S or T parameter memory 320 and a selectable impedance matrix 330. The S/T parameter memory 320 is used to store S or T parameters associated with the probe 110 and, optionally, any of the DUT 120, circuit 125, DSO 200 or user supplied parameters. The parameters stored in the memory 320 are provided via, illustratively, the communication link/control circuit 310. The communication link/control circuit 310 is operatively coupled to the signal analysis device (e.g., a DSO 200), a computer (not shown) or other signal analysis system controller via a communication link COMM, illustratively an Ethernet, Universal Serial Bus (USB) or other communication link. The communication link/control circuit 310 also controls the selectable impedance matrix 330 via a control signal CZ.

The selectable impedance matrix 330 comprises a plurality of impedance elements Z arranged in matrix form. Specifically, a first impedance element in a first row is denoted as $Z_{11}$, while the last impedance element in the first row is denoted as $Z_{1n}$. Similarly, the last impedance element in a first column is denoted as $Z_{m1}$, while the last impedance in the nth column is denoted as $Z_{mn}$. While depicted as an m×n grid or matrix of selectable impedance elements, it will be noted that a more simplified array of impedance elements may be provided. It is also noted that each of the impedance elements may comprise a resistive element, a capacitive element, an inductive element and any combination of active or passive impedance elements. The impedance matrix 330 may provide serial, parallel, serial and parallel or other combinations of passive or active impedances to achieve the purpose of impedance normalization between the DUT (or circuit) and probe 110.

Generally speaking, the purpose of the impedance element matrix 330 is to adapt the input impedance of the probe 110 to the output impedance of the DUT 120 (or circuit 125) such that undue loading of the measured signal parameters is avoided or at least reduced, while there is enough signal passed into probe. At the same time various load ranges must be provided so that adequate DUT 120 loading occurs to provide good signal to noise ratio for the calibration procedure. The impedance matrix 330 may be modified to provide additional normalization. That is, rather than normalizing just the probe 110, the probe tip fixture 340 may also be used to normalize the probe 110 in combination with the input channel of the DSO 200 utilizing the probe 110. Various other permutations will be recognized by those skilled in the art and informed by the teachings of the present invention.

The S/T parameter memory 320 may comprise a non-volatile memory where S or T parameters for probe tip fixture 340 loads are stored. S or T parameters are determined for each of the multiple impedance loads and by-pass impedance loads of the probe tip fixture 340. The by-pass impedance loads connect the DUT to the probe inputs by-passing the multiple impedance loads in the normalization fixture. However, these connections have their own impedance characteristic and are also affected by the impedance characteristics of the normalization fixture. Therefore, the S or T parameters for the by-pass impedance loads are determined and stored in S/T parameter memory 320. These S or T parameters may be provided to the DSO 200 or a computer via the communications link COMM such that additional processing may be performed within the DOS 200 or the computer.

In one embodiment, the probe or probe normalization fixture 300 has associated with it a plurality of probe tips adapted for use by, for example, different devices under test, different testing programs and the like (e.g., current probes, voltage probes, high-power probes and the like). Each of these probe tips may be characterized by respective T parameters or S parameters, which T parameters or S parameters may be stored in the memory 320 of the probe normalization fixture 300. In one embodiment, the communications link/controller 310 detects the type of probe tip attached and responsively adapts the T or S parameters within the memory 320. Thus, the T parameters or S parameters associated with specific probe tips of the normalization fixture 300 may be included within the set of equations describing the testing circuit. The T parameters or S parameters associated with one or more probe tips may also be stored in memory within the probe, the probe tip, the oscilloscope or the fixture.

Figure 5:
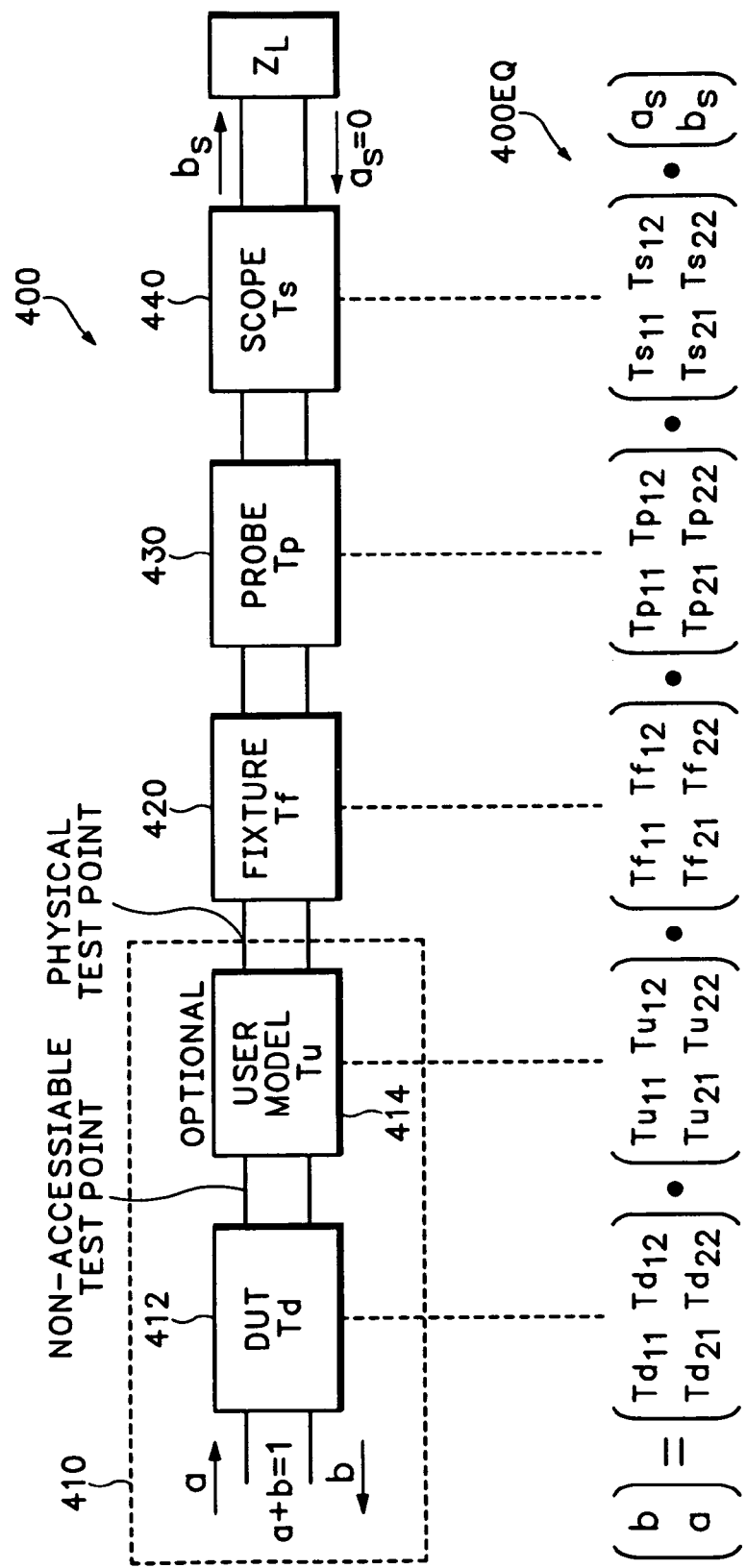
FIG. 5 depicts an exemplary two-port model of a probe normalization signal channel.

FIG. 5 depicts an exemplary two-port model and corresponding equations of a signal path in which a plurality of elements within the signal analysis system 100 are modeled as a series connection of T parameter 2-port networks. Generally, the S or T parameters for a differential system is modeled as a four-port network model as represented in the following equation:

$$\begin{pmatrix} b_{d1} \\ b_{d2} \\ b_{c1} \\ b_{c2} \end{pmatrix} = \begin{pmatrix} \begin{pmatrix} T_{dd11} & T_{dd12} \\ T_{dd21} & T_{dd22} \end{pmatrix} & \begin{pmatrix} T_{dc11} & T_{dc12} \\ T_{dc21} & T_{dc22} \end{pmatrix} \\ \begin{pmatrix} T_{cd11} & T_{cd12} \\ T_{cd21} & T_{cd22} \end{pmatrix} & \begin{pmatrix} T_{cc11} & T_{cc12} \\ T_{cc21} & T_{cc22} \end{pmatrix} \end{pmatrix} \cdot \begin{pmatrix} a_{d1} \\ a_{d2} \\ a_{c1} \\ a_{c2} \end{pmatrix} \quad (EQ\ 3)$$

where $T_{dd}$ are the differential T parameters, $T_{cc}$ are the common mode T parameters, $T_{dc}$ are the mode conversion that occurs when an element is excited with a common mode signal and a differential signal is measured, and $T_{cd}$ are the mode conversion that occurs when an element is excited with a differential mode signal and the common mode response is measured. In the below two-port network model, the signal analysis system 100 is assumed to have a high common mode rejection ratio allowing for the common mode components to be ignored. The model 400 (and corresponding equations 400EQ) of FIG. 5 comprises a device under test 2-port network 410 (denoted as Td), a fixture 2-port network 420 (denoted as Tf), a probe 2-port network 430 (denoted as Tp) and a scope 2-port network 440 (denoted as Ts). The DUT 2-port network 410 is depicted as including a DUT network 412 (Td) and a user model 414 (denoted as Tu).

The user model 2-port network 414 (Tu) is optionally provided and gives a T parameter model for part of the hardware of a device under test. For example, the user model 414 may be used to represent the operating characteristics of a portion of a DUT between an accessible portion (i.e., where probes are operably coupled) to a desired test portion that is normally inaccessible within the DUT (i.e., a portion on the edge of or within a die). The user model accommodates this by letting the user load the S parameter model (or T parameter model) into, for example, the DSO, where it becomes part of the calibration process. For example, if the user knows the S parameters for a bond wire connection from an IC pin to a die chip, then the T parameter model of the connection may be included in the calculations as the Tu matrix. After system calibration, a probe of the IC pin will result in a waveform representing the die chip signal level.

In general, the invention operates to obtain a frequency domain result by using an FFT transform of the measured incident signal, $b_s$, for each of the selected calibration impedance loads inserted into the signal path. After a final $v_{open}$ is computed a frequency domain equalization filter is computed using the $v_{open}$ response and one of the transformed measured incident signal, $b_s$, of the selected calibration impedance loads. The resulting equalization filter may be transformed to the time domain by using an IFFT. Alternately, the $v_{open}$ response may be transformed to the time domain using an IFFT and a time domain equalization filter may be computed using time domain $v_{open}$ response and one the time domain measured incident signals of the selected calibration impedance loads.

For illustrative purposes, several assumptions will be made. For initial derivations, the DUT 2-port model will be assumed to have input incidence signal of a and a reflected signal of b, where a and b are normalized such that a+b=1. The Td, user DUT, will have internal signal and this results in what will be called the normalized Td parameters. It is also assumed the signal analysis system will be modeled as a series of S parameter two port networks, which will be converted to T transfer parameters for ease of matrix solutions. These two port networks represent the user's circuit under test and are ordered (per FIG. 5 and equation 4) left to right as DUT, User DUT Model, Fixture, Probe, and Oscilloscope.

In order to simplify the measurement equations it will be assumed that the scope and it's input connector has a nominally flat frequency response. It will also be assumed that the input voltage to port model Td is a+b, and that a+b is a constant voltage source internal to the Td circuit at it's input port. It will also be assumed that scope input channel and connector provides a relatively flat 50 ohm impedance match over the relevant bandwidth. However, other versions of the measurement may also take into account the parameters of the scope response. This does not preclude the possibility that the scope T parameters would also be included in the normalization. It is also possible that an assumption of $a_s$ equal zero at the two-port output of the S parameter model for the scope might be made.

$$\begin{pmatrix} b \\ a \end{pmatrix} = \begin{pmatrix} Td_{11} & Td_{12} \\ Td_{21} & Td_{22} \end{pmatrix} \cdot \begin{pmatrix} Tu_{11} & Tu_{12} \\ Tu_{21} & Tu_{22} \end{pmatrix} \cdot \begin{pmatrix} Tf_{11} & Tf_{12} \\ Tf_{21} & Tf_{22} \end{pmatrix} \cdot$$
$$\begin{pmatrix} Tp_{11} & Tp_{12} \\ Tp_{21} & Tp_{22} \end{pmatrix} \cdot \begin{pmatrix} Ts_{11} & Ts_{12} \\ Ts_{21} & Ts_{22} \end{pmatrix} \cdot \begin{pmatrix} a_s \\ b_s \end{pmatrix}$$

Equation 4

Where: Td is the transfer parameters of the DUT;
Tu is a user model of part of circuit under test;
Tf is the transfer parameters of the probe test fixture;
Ts is the transfer parameters of the oscilloscope
Tp is the transfer parameters of the probe;
$b_s$ is the voltage measured at the DSO output; and
$a_s$ is the reflected voltage at the DSO output (assumed to be zero for this derivation, though other derivations and implementation may include it).

Considering the assumptions that a+b=1 and $a_s$=0, EQ 3 can be re-written as follows:

$$(1\ 1)\begin{pmatrix} b \\ a \end{pmatrix} =$$
$$(1\ 1)\begin{pmatrix} Td_{11} & Td_{12} \\ Td_{21} & Td_{22} \end{pmatrix} \cdot \begin{pmatrix} Tu_{11} & Tu_{12} \\ Tu_{21} & Tu_{22} \end{pmatrix} \cdot \begin{pmatrix} Tf_{11} & Tf_{12} \\ Tf_{21} & Tf_{22} \end{pmatrix} \cdot$$
$$\begin{pmatrix} Tp_{11} & Tp_{12} \\ Tp_{21} & Tp_{22} \end{pmatrix} \cdot \begin{pmatrix} Ts_{11} & Ts_{12} \\ Ts_{21} & Ts_{22} \end{pmatrix} \cdot \begin{pmatrix} 0 \\ b_s \end{pmatrix}$$

Equation 4A such that:

$$1 = a+b = (Td_1\ Td_2) \cdot \begin{pmatrix} Tu_{11} & Tu_{12} \\ Tu_{21} & Tu_{22} \end{pmatrix} \cdot \begin{pmatrix} Tf_{11} & Tf_{12} \\ Tf_{21} & Tf_{22} \end{pmatrix} \cdot$$
$$\begin{pmatrix} Tp_{11} & Tp_{12} \\ Tp_{21} & Tp_{22} \end{pmatrix} \cdot \begin{pmatrix} Ts_{11} & Ts_{12} \\ Ts_{21} & Ts_{22} \end{pmatrix} \cdot \begin{pmatrix} 0 \\ b_s \end{pmatrix}$$

Equation 4B where:

$$Td_1 = Td_{11} + Td_{21}$$
$$Td_2 = Td_{12} + Td_{22}$$

(EQ 4C)

It should be noted that each of the selected impedance loads and by-pass impedance loads switched onto the DUT 120 has a different set of Tf. The values of Tf, and Tp are measured at time of manufacture and stored in the probe and probe tip fixture 340 respectively. In the automated calibration mode, the values of Td are computed by making a measurement of $b_s$ with the each of the selected impedance loads of Tf and then solving the appropriate set of equations. The test setup for the automated calibration mode has the probe tip fixture 340 connect to DUT 120 and that probe 110 connects into test fixture. In the manual calibration mode, the values Td are preferably computed by making a measurement of $b_s$ with the probe load Tp and with selected impedance loads Tf and then solving the appropriate set of equations. The test setup for the manual calibration mode preferably has the probe 110 connected to the DUT 120 for acquiring initial SUT samples and then connecting selected impedance loads from probe tip fixture 340 or probe load adapters 350 and acquiring additional SUT samples for each selected impedance load, $b_s$ is measured for each of the sample acquisitions and the value of Td is computed by solving the appropriate set of equations.

Figure 6:
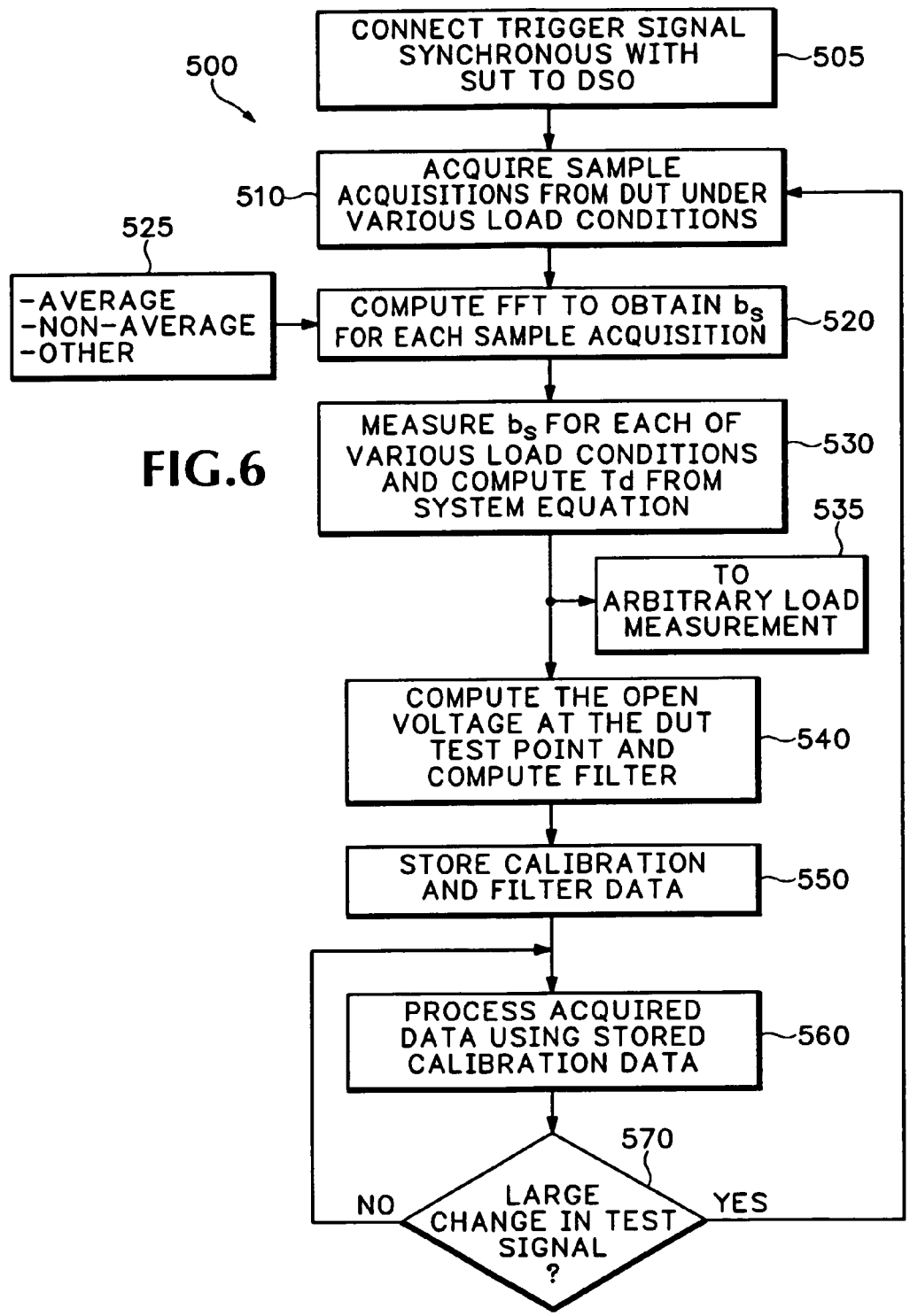
FIG. 6 depicts a flow diagram of a signal path calibration method.

FIG. 6 depicts a flow diagram of a method according to an embodiment of the invention. The method 500 of FIG. 6 is suitable for use in, for example, the system 100 of FIG. 1. The method utilizes the two port model discussed above and assumes that the test signal provided by the DUT 120 is a relatively steady-state signal (i.e., relatively stable or repeating spectral and/or time domain energy distribution). The equations discussed herein with respect to FIG. 6 (and other figures) depict a plurality of two-port representations including device under test, user, normalization fixture, probe and/or scope T parameters. The invention may be practiced using only the device parameters Td, fixture parameters Tf and probe parameters Tp where the method and apparatus are adapted for compensating for the loading imparted to a device under test by a probe 110. The addition of the scope T parameters Ts and/or user parameters Tu may be employed in various embodiments. Thus, equations provided herein may be utilized without the user (Tu) and/or scope (Ts) parameters.

The method 500 may be entered at step 505, where a trigger signal synchronous with the signal under test is coupled to an external trigger input of the DSO 200. If the relative time constants between the DUT 120 and the impedance loads in the normalization test fixture 300 are small, then the trigger signal need not be applied to the signal analysis system 100, and the method 500 proceeds to step 510, where time domain samples of the signal under test are acquired from the DUT 120 under various impedance load conditions of the signal path. The impedance load conditions may include the probe impedance, selected impedance loads of the probe tip fixture 340 and the impedance loads of the probe adapter fixtures. At step 520, Fast Fourier Transforms (FFT) are computed to obtain the $b_s$ for each sample acquisition using the selected impedance load. Referring to box 525, the computation may be performed using averaged or non-averaged data.

At step 530, $b_s$ is measured and Td is computed each of the sample acquisitions of the selected impedance loads (probe tip impedance loads, probe adapter impedance loads, probe impedance load). Td is computed using (for the exemplary embodiment), the following equations:

$$1 = (Td_1\ Td_2) \cdot \begin{pmatrix} Tu_{11} & Tu_{12} \\ Tu_{21} & Tu_{22} \end{pmatrix} \cdot \begin{pmatrix} Tf1_{11} & Tf1_{12} \\ Tf1_{21} & Tf1_{22} \end{pmatrix} \cdot$$
$$\begin{pmatrix} Tp_{11} & Tp_{12} \\ Tp_{21} & Tp_{22} \end{pmatrix} \cdot \begin{pmatrix} Ts_{11} & Ts_{12} \\ Ts_{21} & Ts_{22} \end{pmatrix} \cdot \begin{pmatrix} 0 \\ b_s \end{pmatrix}$$

Equation 5

$$1 = (Td_1\ Td_2) \cdot \begin{pmatrix} Tu_{11} & Tu_{12} \\ Tu_{21} & Tu_{22} \end{pmatrix} \cdot \begin{pmatrix} Tf2_{11} & Tf2_{12} \\ Tf2_{21} & Tf2_{22} \end{pmatrix} \cdot$$
$$\begin{pmatrix} Tp_{11} & Tp_{12} \\ Tp_{21} & Tp_{22} \end{pmatrix} \cdot \begin{pmatrix} Ts_{11} & Ts_{12} \\ Ts_{21} & Ts_{22} \end{pmatrix} \cdot \begin{pmatrix} 0 \\ b_{2s} \end{pmatrix}$$

Equation 6

$$1 = (Td_1\ Td_2) \cdot \begin{pmatrix} Tu_{11} & Tu_{12} \\ Tu_{21} & Tu_{22} \end{pmatrix} \cdot \begin{pmatrix} Tf3_{11} & Tf3_{12} \\ Tf3_{21} & Tf3_{22} \end{pmatrix} \cdot$$
$$\begin{pmatrix} Tp_{11} & Tp_{12} \\ Tp_{21} & Tp_{22} \end{pmatrix} \cdot \begin{pmatrix} Ts_{11} & Ts_{12} \\ Ts_{21} & Ts_{22} \end{pmatrix} \cdot \begin{pmatrix} 0 \\ b_{3s} \end{pmatrix}$$

Equation 7

To solve for the variables Td1 and Td2, two equations obtained from measurements acquisitions with two different impedance loads are sufficient. However, the inventors note that multiple equations from multiple measurement acquisitions using different impedance loads can improve the accuracy of Td1 and Td2 values by, for example, simple averaging or minimum least square error methods.

At step 540, the open voltage at the DUT probe point is calculated by replacing the two-port network with a two-port representation of an open circuit, as follows:

$$1 = (Td_1\ Td_2) \cdot \begin{pmatrix} 1 & 0 \\ 0 & 1 \end{pmatrix} \cdot \begin{pmatrix} a_0 \\ b_0 \end{pmatrix}$$

(EQ 8)

The inventors note that the open circuit voltage $v_{open}$ is actually twice the value of $a_o$ since in the open circuit case $a_o = b_o$ and $v_{open} = a_o + b_o$, such that:

$$v_{open} = 2a_0 = \frac{2}{Td_1 + Td_2} \quad (EQ\ 9)$$

At step 540 equations are derived from the above measurement acquisitions to realize a frequency domain filter response. The frequency domain response of the equalization filter can be derived from its transfer function. The equalization filter transfer function is as follows:

$$H(f) = \frac{v_{open}}{b_{is}} \quad (EQ\ 10)$$

such that:

$$\hat{v}_{open} = H(f) \cdot \hat{b}_s \quad (EQ\ 11)$$

where $b_{is}$ is the scope measurement I-th load during calibration procedure, and $\hat{b}_s$ is the scope measurement with the same I-th load during testing procedure.

It should be noted that transfer function for the equalization filter H(f) is a function of one of the measured $b_s$ for the selected impedance loads. For example, in the automated calibration mode, $b_s$ is measured for each of the SUT acquisitions with a selected impedance load (i.e. $b_s$, $b_{2s}$, $b_{3s}$) inserted into the signal path. One of the measured $b_s$'s is used for computing the equalization filter H(f). In subsequent acquisitions of the SUT using the equalization filter H(f), the impedance load of the measured $b_s$ used for the equalization filter H(f) computation needs to inserted into the signal path for the accurate removal of signal degrading effects from the measurement of the DUT (or circuit) including transmission errors in the system. In the manual calibration mode, the measurement of $b_s$ for each of the SUT acquisitions can include an SUT acquisition with the only the probe 110 in the signal path and at least a second SUT acquisition with one of the selected impedance loads from the probe tip fixture 340 or the probe load adapters 350 and the probe in the signal path. As with the automated calibration mode, one of the measured $b_s$'s is used for computing the equalization filter H(f). If the measured bs for the SUT acquisition using only the probe 110 is used for computing the equalization filter H(f), them in subsequent acquisition of the SUT using the equalization filter H(f), the probe 110 may be connected directly to the DUT test point. If the measured $b_s$ for one of the selected impedance loads is used for computing the equalization filter H(f), the selected impedance load needs to be inserted in the SUT signal path for subsequent acquisitions of the SUT using the equalization filter H(f).

In an alternative embodiment, the computed frequency domain $v_{open}$ voltage may be transformed in time domain representation of the $v_{open}$ voltage using well known transformation techniques such as an inverse FFT, inverse DFT and the like. One of the time domain acquisitions of the SUT using one of the selected impedance loads is used to compute a time domain equalization filter h(f).

At step 550, the calibration data and, optionally, filter data is stored in, for example, the data portion 259D of the memory 258. It is noted that in the above solution (EQ 9), the term $2a_o$ represents the voltage in the DUT probe point with substantially all effects of probing and signal path transmission errors de-embedded. This is the desired result of the calibration process.

At steps 560, the method operates to repeatedly process acquired data using the stored calibration data (i.e. equalization filter) to provide de-embedded data for generating waveforms, providing test data to remote devices and the like. In one embodiment, the frequency domain equalization filter H(f) is multiplied with an FFT of each new time domain acquisition with the probe at a DUT probe point to provide thereby a de-embedded frequency response of the SUT at the DUT test point. The de-embedded frequency response at the DUT test point may be transformed using well known transformation techniques, such as an inverse FFT, inverse DFT and the like, to generate a de-embedded time domain response of the SUT at the DUT test pont.

In a further embodiment, the frequency domain equalization filter H(f) is converted to a time domain equalization filter h(f) using well known transformation techniques, such as an inverse FFT, inverse DFT and the like. The time domain equalization filter h(f) is convolved with each new time domain acquisition with the probe at a DUT test point to provide thereby a de-embedded response of the SUT at the DUT test point. Thus, the T parameters for the DUT (and, optionally, corresponding parameters for the normalization fixture 300, probe 110 and/or DSO 200) are determined such that an equalization H(f) or h(t) filter based upon the various parameters may be determined. This equalization filter H(f) or h(t) is applied to the signal under test to compensate for the loading of the system upon the device under test and transmission error in the signal analysis system 100.

Upon detecting (at step 570) a relatively large change in the test signal, the method proceeds to step 510. For example, during calibration the changes in measured voltages as a function of frequency for various impedance loads connected is noted by the controlling device (e.g., a DSO). The controlling device then chooses only those impedance loads that give minimal change in DUT voltage while still providing enough change to have a reasonable signal to noise ratio for the de-embed computations.

Once calibration has been performed and the DUT signal is being observed with de-embedding, the user is alerted if a major difference in the signal occurs in terms of signal level or waveshape. In an alternate embodiment, another calibration is performed for this case so that the user can make determinations of circuit linearity based on signal level. For example if the DUT signal was calibrated with one level and then changed to another amplitude level then the user measures the new level with the current calibration. Then the user optionally performs a new calibration and measure this signal again. If the measured results are different between the two calibrations then that would be an indication of non-linear DUT behavior at different signal levels.

In still another embodiment, where the user knows the S or T parameters of a particular DUT test point, those test parameters are loaded into the testing or controlling device via, for example, the above-described menu structure. The S or T parameters includes the S or T parameters of the DUT and may also include the S or T parameters for a circuit deposed between the DUT and the test point. In this embodiment, there is no need to connect the de-embed fixture and the probe is directly connected to the test point.

An acquisition of the SUT at the DUT test point is made and bs is obtained using an FFT transform. The values of $a_{in}$ and $b_{in}$ are computed as shown in the following equation:

$$\begin{pmatrix} b_{in} \\ a_{in} \end{pmatrix} = \begin{pmatrix} Td_{11} & Td_{12} \\ Td_{21} & Td_{22} \end{pmatrix} \cdot \begin{pmatrix} Tu_{11} & Tu_{12} \\ Tu_{21} & Tu_{22} \end{pmatrix} \cdot \\ \begin{pmatrix} Tp_{11} & Tp_{12} \\ Tp_{21} & Tp_{22} \end{pmatrix} \cdot \begin{pmatrix} Ts_{11} & Ts_{12} \\ Ts_{21} & Ts_{22} \end{pmatrix} \cdot \begin{pmatrix} 0 \\ b_s \end{pmatrix}$$ (EQ 12)

The 2-port network model may be implemented with S or T parameters for the DUT ($T_d$) and the probe ($T_p$), and optionally with the S or T parameters for a circuit ($T_u$) and/or the S or T parameters for the oscilloscope ($T_s$)

Once $a_{in}$ and $b_{in}$ are known, then the probe two-port matrix can be replaced with an open circuit two-port representation and the DUT test point voltage can be computed as $2a_{open}$, as follows:

$$a_{in} + b_{in} = (Td_{11} + Td_{21} \cdot Td_{12} + Td_{22}) \begin{pmatrix} a_{open} \\ a_{open} \end{pmatrix}$$ (EQ 13)

$$V_{open} = 2a_{open} = \frac{2(a_{in} + b_{in})}{Td_{11} + Td_{21} + Td_{12} + Td_{22}}$$ (EQ 14)

As with the previous embodiment, equations are derived from the above measurements to realize a frequency domain filter response. The frequency domain response of the filter can be derived from its transfer function. The filter transfer function is as follows:

$$H(f) = \frac{v_{open}}{b_{is}}$$ (EQ 15)

such that:

$$\hat{v}_{open} = H(f) \cdot \hat{b}_s$$ (EQ 16)

where $b_{in}$ is the scope measurement I-th probe load during calibration procedure, and $\hat{b}_s$ is the scope measurement with the same I-th probe load during testing procedure.

The above frequency domain equalization filter H(f) is multiplied with an FFT of each new time domain acquisition with the probe at a test point to provide thereby a de-embedded response at the DUT test point. An inverse FFT of $\hat{v}_{open}$ yields the time domain version of this signal. The frequency domain equalization filter H(f) may be converted to a time domain equalization filter h(t) using well known transformation techniques, such as an inverse FFT, inverse DFT and the like. The time domain equalization filter h(t) is convolved with each new time domain acquisition with the probe at a test point to provide thereby a de-embedded response at the DUT test point.

Figure 7:
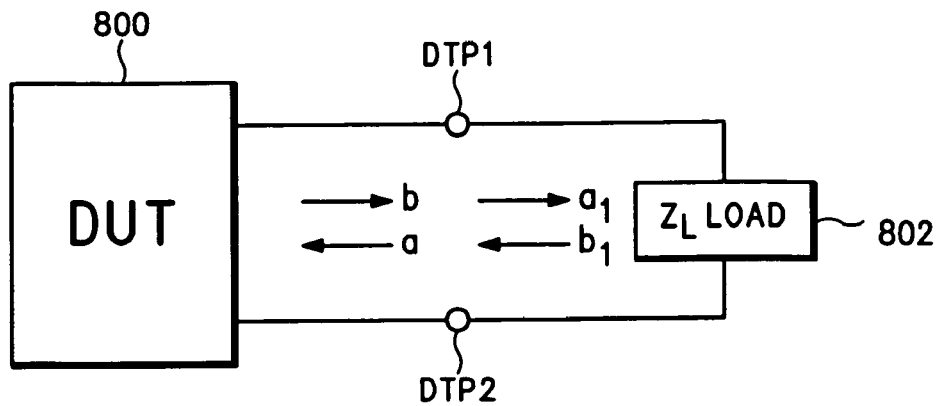
FIG. 7 illustrates a device under test coupled to an arbitrary load for describing an embodiment of the present invention.
Figure 8:
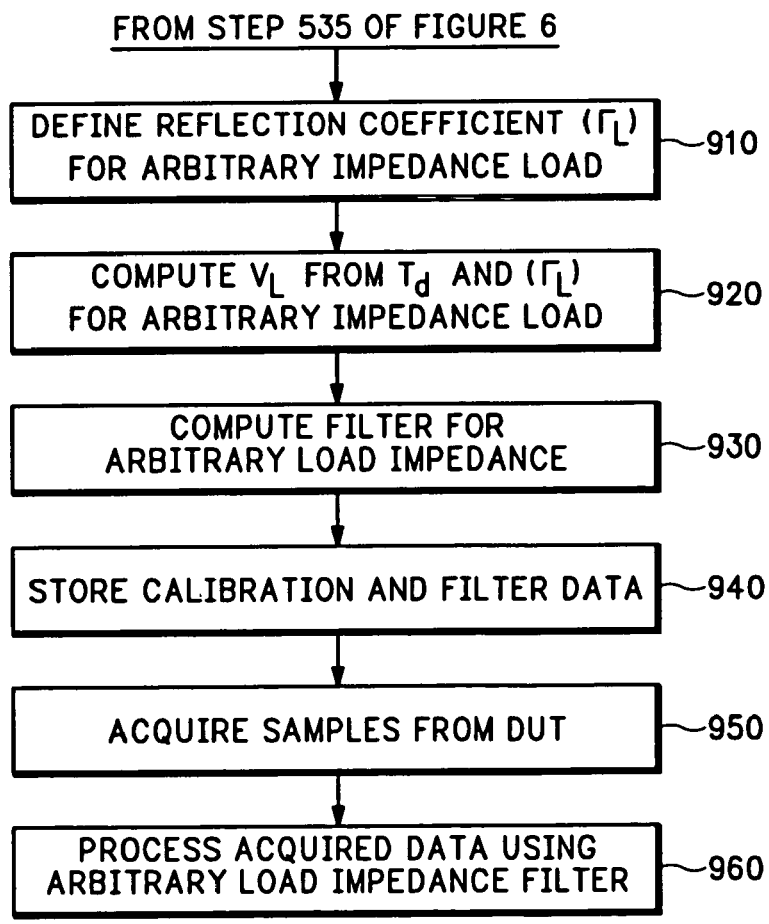
FIG. 8 depicts a flow diagram of a method according to an embodiment of the present invention.

Once the initial measurements have been made and the characterizing equations determined for the T or S parameters of the DUT as represented in steps 510 through 530 in FIG. 6, a computation may be made to determine what the DUT test voltage would look like with an arbitrary load ($Z_L$) as represented in step 535. FIG. 7 is a representation of a DUT 800 connected to an arbitrary load ($Z_L$) 802. The voltage out of the DUT 800 into the DUT test point DTP1 is "b" and the reflected voltage from the DUT test point DTP2 to the DUT 800 is "a". The incident voltage "$a_1$" from the DUT test point DTP1 and the reflected voltage "$b_1$" into the DUT test point DPT2 are related to the DUT as:

$$1 = [Td_1 \ Td_2] \cdot \begin{bmatrix} b_1 \\ a_1 \end{bmatrix}$$ (EQ 17)

where $Td_1$ and $Td_2$ are combinations of the T parameters of the DUT described with relation to the calibration of the signal path. When the DUT is connected to an arbitrary load ($Z_L$) 802, loading can be represented by its reflection coefficient ($\Gamma_L$) where "$a_1$" and "$b_1$" are related by $b_1 = \Gamma_L \cdot a_1$ where the reflection coefficient is the $S_{11}$ parameter of the arbitrary load. The reflection coefficient for the arbitrary load 802 may be specified by the user using the equation:

$$\Gamma_L = \frac{Z_L - Z_{ref}}{Z_L + Z_{ref}}$$ (EQ 18)

where $Z_{ref}$ is known and $Z_L$ is the impedance of the arbitrary load as represented by step 910 in the flow diagram of FIG. 8. In the preferred embodiment of the invention, $Z_{ref}$ is the characteristic impedance of the signal analysis system which is generally 50 ohms but other impedance values may be used without departing from the scope of the present invention.

The total voltage $V_L$ at the test points DTP1 and DTP2 is the sum of the incident voltage and the reflected voltage as shown by the following equation.

$$V_L = a_1 + b_1$$ (EQ 19)

At step 920, the voltage $V_L$ at the test points DTP1 and DTP2 with an arbitrary load having a reflection coefficient of $\Gamma_L$ can be derived from the previous equations and written as follows:

$$V_L = \frac{\Gamma_L + 1}{\Gamma_L Td_1 + Td_2}$$ (EQ 20)

With the transfer parameters $Td_1$ and $Td_2$ known from the signal path calibration and the reflection coefficient $\Gamma_L$ of the arbitrary load $Z_L$ provided by the user, a frequency domain equalization filter may be realized at step 930 having a transfer function as follows:

$$H(f) = \frac{V_L}{b_{is}}$$ (EQ 21)

such that:

$$\hat{v}_L = H(f) \cdot \hat{b}_s$$ (EQ22)

where $b_{is}$ is the scope measurement I-th load during calibration procedure, and $\hat{b}_s$ is the scope measurement with the same I-th load during testing procedure.

As with the open load $V_{open}$ equalization filter, the transfer function for the arbitrary load equalization filter is a function of one of the measured $b_s$ for the selected impedance loads during the calibration procedure. That is, the impedance load inserted into the signal path for the signal acquisition used for the measured $b_s$ in computing the arbitrary load equalization filter, needs to be inserted in the signal path for subsequent signal acquisitions of the signal under test. The signal path impedance load may be the impedance load of the probe 110, one of the selected impedance loads of the probe tip fixture 340, or the impedance load of one of the probe load adapters 350.

In an alternative embodiment, the frequency domain equalization filter H(f) may be converted to a time domain equalization filter h(t) using well known transformation techniques, such as an inverse FFT, inverse DFT and the like. In a further alternative embodiment, the computed frequency domain $v_L$ voltage may be transformed in time domain representation of the $v_L$ voltage using well known transformation techniques such as an inverse FFT, inverse DFT and the like. One of the time domain acquisitions of the SUT using one of the selected impedance loads is used to compute a time domain equalization filter h(t). In still a further alternative embodiment where the transfer parameters of the device under test are known, the equalization filter H(f) may be derived from the known transfer parameters and the reflection coefficient of $\Gamma_L$ for the arbitrary load.

At step 940, the calibration data from steps 510 through 530, and optionally, equalization filter data for the arbitrary impedance load is stored in, for example, the data portion 259D of the memory 258. At 950 and 960, time domain samples are acquired with the probe at the test points DTP1 and DTP2. The time domain samples are converted to frequency domain representations and multiplied by the frequency domain arbitrary load equalization filter to provide a representation of the arbitrary impedance 802 loading of the DUT 800. The frequency domain representation of the arbitrary impedance 802 is converted to a time domain representation using well known transformation techniques, such as an inverse FFT, inverse DFT and the like. The acquired time domain samples may be convolved with the time domain arbitrary load equalization filter to provide a representation of the arbitrary impedance 802 loading of the DUT 800. The resulting output from the equalization filter H(f) or h(t) may be used for generating waveforms, providing test data to remote devices and the like. Using the arbitrary impedance load invention, a user may examine the signal at the DUT probe point with various arbitrary impedance loads to observe the effects of loads on the signal. For example, an arbitrary load equal to a signal analysis system reference impedance $Z_{ref}$ of 50 ohms would have a reflection coefficient ($\Gamma_L$) of 0 where equation 16 would yield:

$$V_{Zref} = \frac{1}{Td_2} \quad \text{(EQ 23)}$$

where $V_{Zref}$ is the voltage at the test points DTP1 and DTP2 terminated by the reference impedance.

Figure 9A:
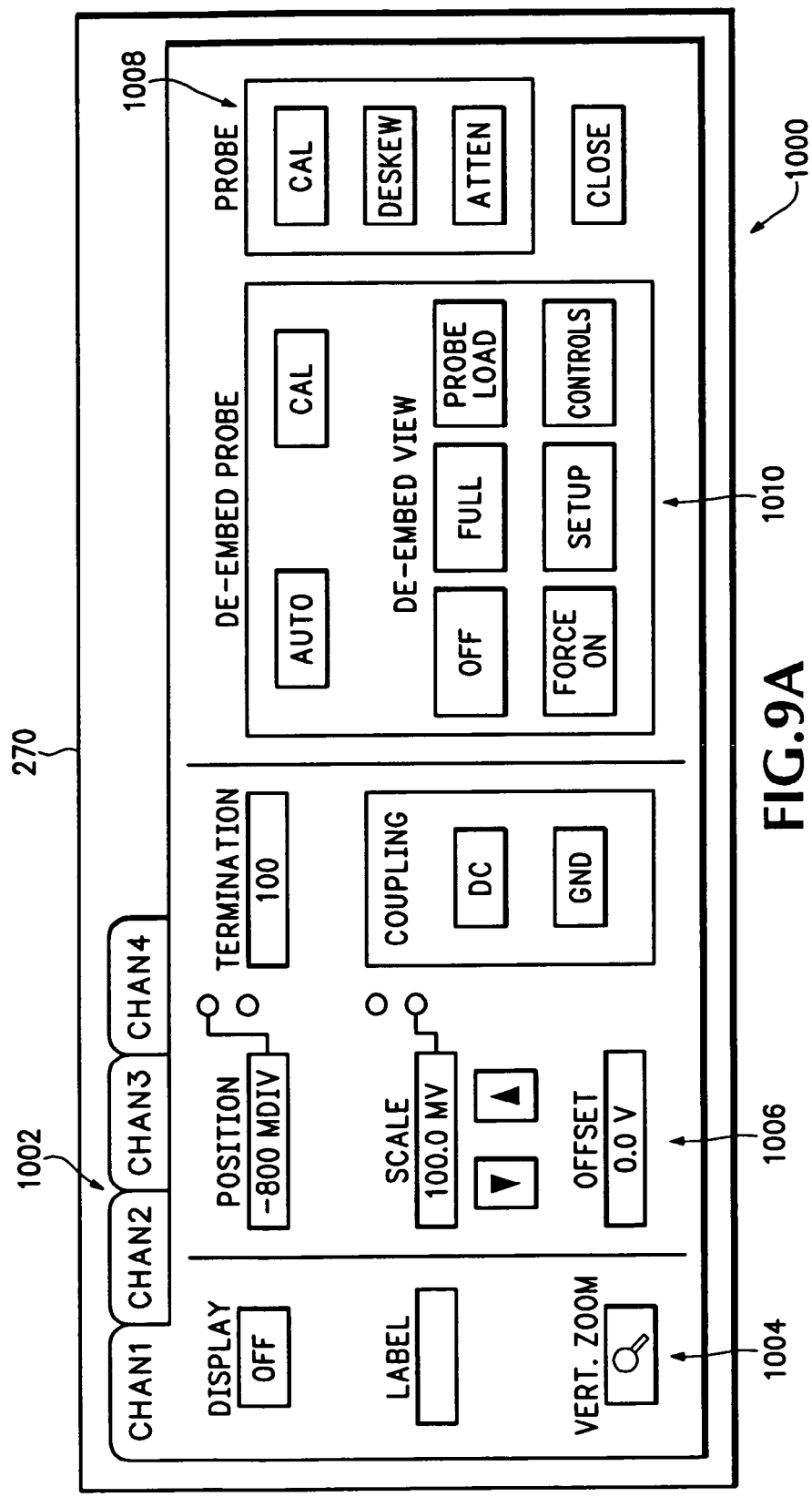
FIG. 9A depicts a user interface screen suitable for use in an embodiment of the present invention.

FIG. 9A illustrates an example of a user interface 1000 for implementing the calibration and the arbitrary impedance load method of the present invention. The user interface 1000 may be implemented as part of the vertical menu on a TDS6804B Digital Phosphor Oscilloscope, manufactured and sold by Tektronix, Inc. Beaverton, Oreg. The user interface 1000 is displayed on the display device 270 under control of the controller 250. The user interface has channel tabs 1002 for each of th respective channels of the oscilloscope 200. The controller 250 detects the presence of probe capable of being de-embedded and configures the user interface 1000 accordingly. The user interface 1000 is divided into sections with section 1004 related to display parameters and section 1006 related to the channel conditioning parameters. Section 1008 relates to selectable probe procedures, such as a standard probe calibration procedure, a procedure for deskewing multiple probes coupled to the oscilloscope, and a procedure for setting the probe attenuation. Section 1010 relates to the parameters and procedures for de-embedding the probe.

Figure 9B:
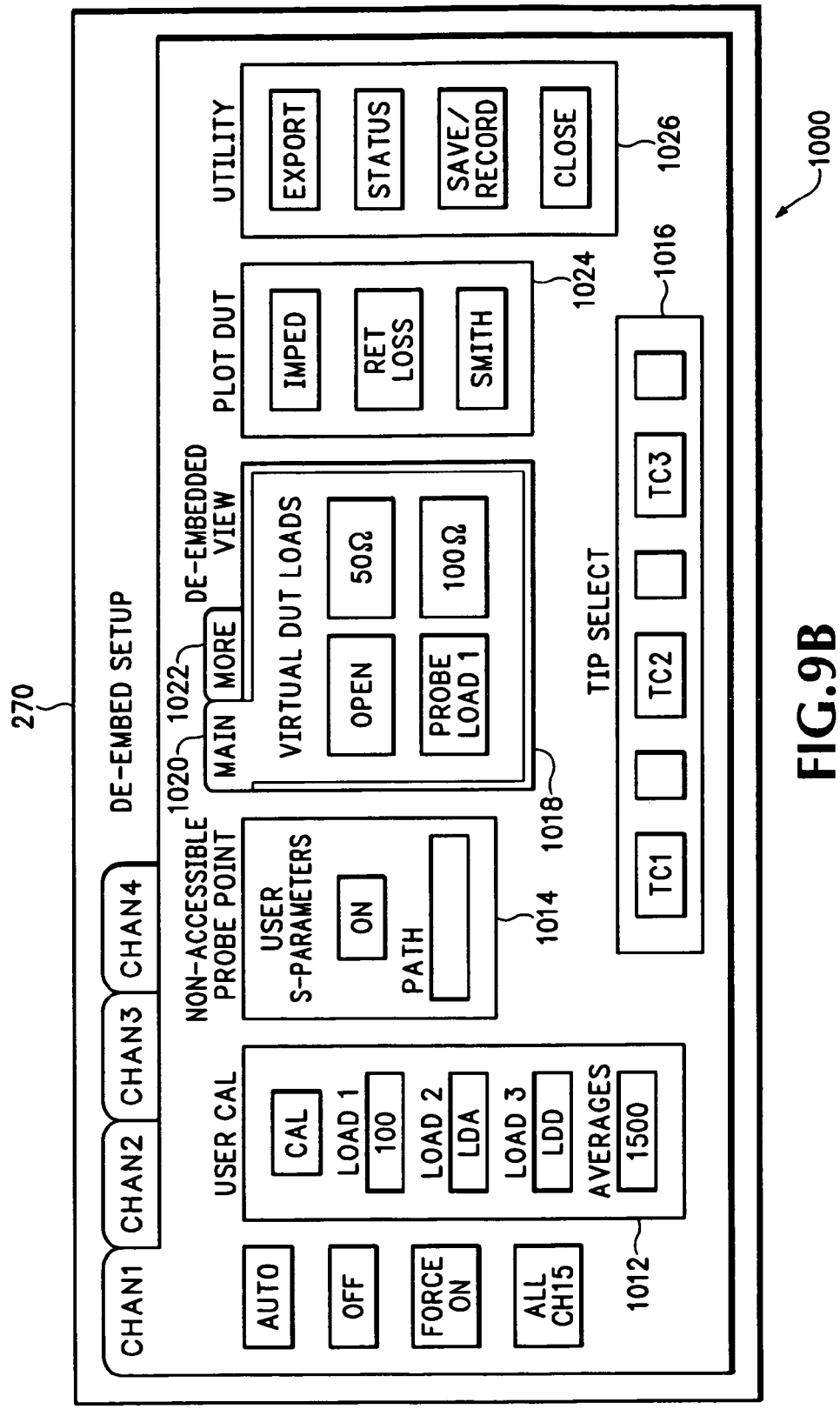
FIG. 9B depicts a setup user interface screen suitable for use in an embodiment of the present invention.

The CAL menu button is pressed by the user after the probe has been connected to the DUT 800. A pop-up dialog box having FINISH and CANCEL button may be included to prompt the user to make sure the probe is connected to the DUT 800. The calibration process applies de-embed loads to the DUT 800 test points DTP1 and DTP2 and calculates the combination of S or T parameters $Td_1$ and $Td_2$ of the DUT 800. The AUTO button turns on the de-embed filter operations, such as full de-embed and the arbitrary load testing, as long as the scope parameters allows it. The OFF button turns off the de-embed filter operation resulting the acquired samples having errors due to the probe loading and through response and due to the oscilloscope response. Various parameter setting for the oscilloscope may cause the filter not to run. The FORCE ON button addresses this issue by changing the oscilloscope parameter setting to allow the de-embed filter to run. The FULL de-embed view configures the filter operation to process the acquired samples as if the DUT 800 is coupled to an open load. The PROBE LOAD de-embed view configures the filter operation to process the acquired samples as if the DUT 800 is coupled a probe having its associated impedance. The SETUP button brings up a display of a de-embed setup menu that contains additional controls for configuring the de-embed probe FIG. 9B illustrates an example of a de-embed setup menu. On the left side of the display are the AUTO, OFF and FORCE on buttons previously described. The all channels ALL CHLS button when activated will force the AUTO/OFF/FORCE ON functions to occur on all channels that have a de-embed probe connected. THE USER CAL section 1012 of the display includes the CAL button previously described and fields for defining the de-embed loads that are to be used when the CAL process is executed. LOAD 1, LOAD2 and LOAD3 allow the user to specify the de-embed cal loads that are used during calibration. Alternately, the system may be configured to automatically set specified de-embed cal loads. The AVERAGES field specifies the number of averages used for the signal acquisitions during the CAL process. The NON-ACCESSIBLE PROBE POINT section 1014 includes an ON/OFF button and a field for entering a path to a two-port S or T parameter file defining the characteristics of a portion of the DUT 800 between the probe test points DTP1 and DPT2 and the circuit test points CTP1 and CTP2. With the ON/OFF button on, the two-port S or T parameter file is included in the calibration of the probe. The TIP SELECT section 1016 of the display allows a user to specify a particular probe load adapter or probing tip that is to be connected to the probe. The oscilloscope has a library of S or T parameters for the available probe load adapters and probing tips. Type numbers identify the probe load adapters and probing tips and the display may include pictures of the adapters and tips to allow the user to be sure that the selected adapter or tip matches the selected parameters.

The DE-EMBEDDED VIEW section 1018 has a MAIN tab 1020 and a MORE tab 1022. The MAIN tab 1020 displays buttons that activate various virtual DUT loads. The OPEN button activates the de-embed filter that results in a full de-embed (i.e. an equalization filter representing an open load on the DUT). The loading effects of the probe, the through response of the probe and scope are removed from the acquired samples of the DUT signal. The PROBE LOAD 1 button activates a de-embed filter that results in the acquired samples representing the DUT signal with the probe loading the DUT signal. The error due to the probe through response and the oscilloscope response are removed from the acquired samples. The 50Ω and 100Ω buttons respectively activate de-embed filters that results in the acquired samples representing the DUT signal with a 50 ohm load and a 100 ohm load coupled to the DUT. The PLOT DUT section 1024 of the display has buttons that allows the user to activate display plots of the impedance, return loss, and a smith chart of the impedance derived from the acquired samples of the DUT signal. The Utility section 1026 of the display includes an EXPORT button that when activated brings up an export menu dialog box. The dialog box allows a user to specify a file name and export an ASCII file of the processed data from the DUT. The STATUS button activates a view window with information about the relevant parameters associated with the de-embed operation. The SAVE/RECORD button activates a submenu that allows the user to save the current DUT test point calibration data and filter to a file. It includes a field that allows the user to enter a name associated with each DUT test point.

Figure 9C:
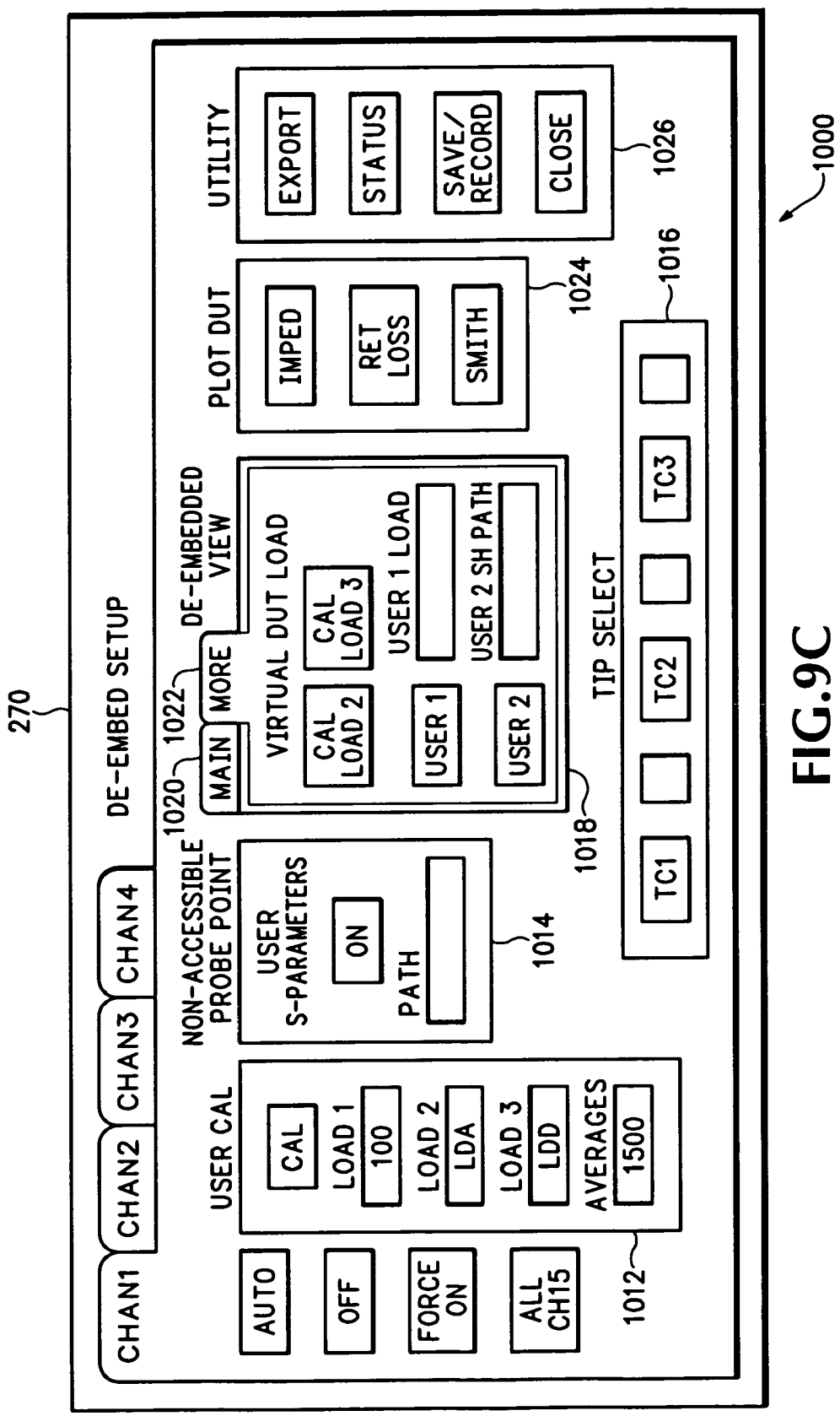
FIG. 9C depicts a further setup user interface screen suitable for use in an embodiment of the present invention.

FIG. 9C illustrates an example of the DE-EMBEDDED VIEW section 1018 where the MORE tab 1022 has been activated. The MORE tab 1022 displays buttons that activate additional virtual DUT loads. The CAL LOAD2 and CAL LOAD3 buttons respectively activate de-embed filters that results in the acquired samples representing the DUT signal with the CAL LOAD2 and the CAL LOAD3 loading the DUT signal. The USER1 button and associated field activates a de-embed filter having an arbitrary impedance load defined by the user. The load value may be specified as a single resistance element or a single reactive element or combination of the two. For example, an entry of 75 in the filed means 75 ohms resistance. A value of j85 means an inductive reactance of 85 ohms. A value of 35-j77 means a combination of a resistance of 35 ohms and capacitive reactance of 77 ohms. The USER2 button and associated filed activates a de-embed filter having an arbitrary impedance defined by an S or T parameter file and path. The $S_{11}$ parameter or its T parameter equivalent would be contained in an ASCII format in a file provided by the user. This allows the user to specify a very complex load that varies as a function of frequency.

The present invention is a system and process that characterizes the transfer parameters of a device under test using acquired samples of the signal from a device under test, assigning an arbitrary impedance load to the device under test derived from a reflection coefficient, computing an equalization filter adapted to represent the loading of the device under test by the arbitrary impedance, and processing additional acquired samples using the equalization filter to effect thereby a representation of the arbitrary impedance loading of the device under test. The arbitrary impedance load may be a user assigned resistance value, reactance value, a combination of both, S or T parameters associated with the probe, oscilloscope, and S or T parameters files.

While the foregoing is directed to the preferred embodiment of the present invention, other and further embodiments of the invention may be devised without departing from the basic scope thereof. For example, the equations presented in the above specification are of a specific form and may be factored to other forms and still represent equivalent equations. Therefore, the scope of the present invention is determined by the claims that follow.

What is claimed is:

1. A method of calibrating a signal path of a signal analysis system for processing acquired signal samples using an arbitrary load comprising the steps of:

acquiring sets of samples in the time domain of a signal under test from a device under test via the signal path including a plurality of selectable impedance loads with the signal path for each set of samples having a selected impedance load of the plurality of selectable impedance loads;

converting the sets of samples of the signal under test in the time domain to a spectral domain representations;

characterizing transfer parameters of the device under test within a spectral domain from the spectral domain representations of the sets of samples;

defining a reflection coefficient ($\Gamma_L$) representative of an arbitrary load coupled to the device under test; and computing arbitrary load open circuit voltages within a spectral domain from the characterized transfer parameters of the device under test and the reflection coefficient ($\Gamma_L$);

computing an equalization filter from the arbitrary load open circuit voltages and the spectral domain representation of one of the sets of samples with the equalization filter adapted to represent the loading of the device under test by the arbitrary load;

converting the computed equalization filter from the frequency domain to a time domain equalization filter;

acquiring at least an additional set of samples in the time domain of the signal under test from the device under test via the signal path including the selectable impedance load of the set of samples used for computing the equalization filter; and processing the additional set of samples using the time domain equalization filter to effect thereby a representation of the arbitrary loading of the device under test.

2. The method of calibrating a signal path of a signal analysis system for processing acquired signal samples using an arbitrary load as recited in claim 1 wherein the acquiring steps further comprise the step of synchronizing the signal under test to a trigger signal.

3. A method of calibrating a signal path of a signal analysis system for processing acquired signal samples using an arbitrary load comprising the steps of:

acquiring sets of samples in the time domain of a signal under test from a device under test via the signal path including a plurality of selectable impedance loads with the signal path for each set of samples having a selected impedance load of the plurality of selectable impedance loads;

converting the sets of samples of the signal under test in the time domain to a spectral domain representations;

characterizing transfer parameters of the device under test within a spectral domain from the spectral domain representations of the sets of samples;

defining a reflection coefficient ($\Gamma_L$) representative of an arbitrary load coupled to the device under test; and computing arbitrary load open circuit voltages within a spectral domain from the characterized transfer parameters of the device under test and the reflection coefficient ($\Gamma_L$);

computing an equalization filter from the arbitrary load open circuit voltages and the spectral domain representation of one of the sets of samples with the equalization filter adapted to represent the loading of the device under test by the arbitrary load;

acquiring at least an additional set of samples in the time domain of the signal under test from the device under test via the signal path including the selectable impedance load of the set of samples used for computing the equalization filter;

converting the additional set of samples in the time domain from the device under test to a spectral domain representation; and processing the spectral domain representation of the additional set of samples using the equalization filter to effect thereby a representation of the arbitrary loading of the device under test.

4. The method of calibrating a signal path of a signal analysis system for processing acquired signal samples using an arbitrary load as recited in claim 3 wherein the acquiring steps further comprise the step of synchronizing the signal under test to a trigger signal.

5. A method of calibrating a signal path of a signal analysis system for processing acquired signal samples using an arbitrary load comprising the steps of:

acquiring a first set of samples in the time domain of a signal under test from a device under test at a test point coupled to the device under test via the signal path including a probe;

acquiring at least a second set of samples in the time domain of a signal under test from a device under test at the test point coupled to the device under test via the signal path including at least a first selectable impedance load coupled between the test point and the probe;

converting the first and second sets of samples of the signal under test in the time domain to spectral domain representations;

characterizing transfer parameters of the device under test within a spectral domain from the spectral domain representation for each of the first and second sets of samples;

defining a reflection coefficient ($\Gamma_L$) representative of an arbitrary load coupled to the device under test; and computing arbitrary load open circuit voltages within a spectral domain from the characterized transfer parameters of the device under test and the reflection coefficient ($\Gamma_L$);

computing an equalization filter from the arbitrary load open circuit voltages and the spectral domain representation of one of first and second sets of samples with the equalization filter adapted to represent the loading of the device under test by the arbitrary load;

converting the computed equalization filter from the frequency domain to a time domain equalization filter;

acquiring at least an additional set of samples in the time domain of the signal under test from the device under test at the test point via the signal path from which the set of samples is used for computing the equalization filter;

processing the additional set of samples using the time domain equalization filter to effect thereby a representation of the arbitrary loading of the device under test.

6. The method of calibrating a signal path of a signal analysis system for processing acquired signal samples using an arbitrary load as recited in claim 5 wherein the acquiring steps further comprise the step of synchronizing the signal under test to a trigger signal.

7. A method of calibrating a signal path of a signal analysis system for processing acquired signal samples using an arbitrary load comprising the steps of:

acquiring a first set of samples in the time domain of a signal under test from a device under test at a test point coupled to the device under test via the signal path including a probe;

acquiring at least a second set of samples in the time domain of a signal under test from a device under test at the test point coupled to the device under test via the signal path including at least a first selectable impedance load coupled between the test point and the probe;

converting the first and second sets of samples of the signal under test in the time domain to spectral domain representations;

characterizing transfer parameters of the device under test within a spectral domain from the spectral domain representation for each of the first and second sets of samples;

defining a reflection coefficient ($\Gamma_L$) representative of an arbitrary load coupled to the device under test; and computing arbitrary load open circuit voltages within a spectral domain from the characterized transfer parameters of the device under test and the reflection coefficient ($\Gamma_L$);

computing an equalization filter from the arbitrary load open circuit voltages and the spectral domain representation of one of first and second sets of samples with the equalization filter adapted to represent the loading of the device under test by the arbitrary load;

acquiring at least an additional set of samples in the time domain of the signal under test from the device under test at the test point via the signal path from which the set of samples is used for computing the equalization filter;

converting the additional set of samples in the time domain from the device under test to a spectral domain representation; and processing the spectral domain representation of the additional set of samples using the equalization filter to effect thereby a representation of the arbitrary loading of the device under test.

8. The method of calibrating a signal path of a signal analysis system for processing acquired signal samples using an arbitrary load as recited in claim 7 wherein the acquiring steps further comprise the step of synchronizing the signal under test to a trigger signal.

9. A method of calibrating a signal path of a signal analysis system for processing acquired signal samples using an arbitrary load comprising the steps of:

providing transfer parameters for a device under test;

acquiring a plurality of samples in the time domain of a signal under test from the device under test at a test point coupled to the device under test via the signal path including a probe;

converting the plurality of samples of the signal under test in the time domain to a spectral domain representation;

defining a reflection coefficient ($\Gamma_L$) representative of an arbitrary load coupled to the device under test; and computing arbitrary load open circuit voltages within a spectral domain from the transfer parameters of the device under test and the reflection coefficient ($\Gamma_L$);

computing an equalization filter from the arbitrary load open circuit voltages and the spectral domain representation of plurality of samples with the equalization filter adapted to represent the loading of the device under test by the arbitrary load;

converting the computed equalization filter from the frequency domain to a time domain equalization filter;

acquiring additional plurality of samples in the time domain of the signal under test from the device under test at the test point via the signal path;

processing the additional plurality of samples using the time domain equalization filter to effect thereby a representation of the arbitrary loading of the device under test.

10. The method of calibrating a signal path of a signal analysis system for processing acquired signal samples using an arbitrary load as recited in claim 9 wherein the acquiring steps further comprise the step of synchronizing the signal under test to a trigger signal.

11. A method of calibrating a signal path of a signal analysis system for processing acquired signal samples using an arbitrary load comprising the steps of:

provecinding transfer parameters for a device under test;

acquiring a plurality of samples in the time domain of a signal under test from the device under test at a test point coupled to the device under test via the signal path including a probe;

converting the plurality of samples of the signal under test in the time domain to a spectral domain representation;

defining a reflection coefficient ($\Gamma_L$) representative of an arbitrary load coupled to the device under test; and computing arbitrary load open circuit voltages within a spectral domain from the transfer parameters of the device under test and the reflection coefficient ($\Gamma_L$);

computing an equalization filter from the arbitrary load open circuit voltages and the spectral domain representation of plurality of acquired samples with the equalization filter adapted to represent the loading of the device under test by the arbitrary load;

acquiring additional plurality of samples in the time domain of the signal under test from the device under test at the test point via the signal path;

converting the additional plurality of samples in the time domain from the device under test to a spectral domain representation; and processing the spectral domain representation of the additional plurality of samples using the equalization filter to effect thereby a representation of the arbitrary loading of the device under test.

12. The method of calibrating a signal path of a signal analysis system for processing acquired signal samples using an arbitrary load as recited in claim 11 wherein the acquiring steps further comprise the step of synchronizing the signal under test to a trigger signal.

13. A method of calibrating a signal path of a signal analysis system for processing acquired signal samples using an arbitrary load comprising the steps of:

acquiring sets of samples in the time domain of a signal under test from a device under test via the signal path including a plurality of selectable impedance loads with the signal path for each set of samples having a selected impedance load of the plurality of selectable impedance loads;

converting the sets of samples of the signal under test in the time domain to a spectral domain representations;

characterizing transfer parameters of the device under test within a spectral domain from the spectral domain representations of the sets of samples;

defining a reflection coefficient ($\Gamma_L$) representative of an arbitrary load coupled to the device under test; and computing arbitrary load open circuit voltages within a spectral domain from the characterized transfer parameters of the device under test and the reflection coefficient ($\Gamma_L$);

converting the arbitrary load open circuit voltages from the spectral domain to the time domain;

computing an equalization filter from the computed time domain arbitrary load open circuit voltages and one of the sets of samples in the time domain with the equalization filter adapted to represent the loading of the device under test by the arbitrary load;

acquiring at least an additional set of samples in the time domain of the signal under test from the device under test at the test point via the signal path including the selectable impedance load of the set of samples used for computing the equalization filter; and processing the additional set of samples using the time domain equalization filter to effect thereby a representation of the arbitrary loading of the device under test.

14. The method of calibrating a signal path of a signal analysis system for processing acquired signal samples using an arbitrary load as recited in claim 13 wherein the acquiring steps further comprise the step of synchronizing the signal under test to a trigger signal.

15. A method of calibrating a signal path of a signal analysis system for processing acquired signal samples using an arbitrary load comprising the steps of:

acquiring a first set of samples in the time domain of a signal under test from a device under test at a test point coupled to the device under test via the signal path including a probe;

acquiring at least a second set of samples in the time domain of a signal under test from a device under test at the test point coupled to the device under test via the signal path including at least a first selectable impedance load coupled between the test point and the probe;

converting the first and second sets of samples of the signal under test in the time domain to spectral domain representations;

characterizing transfer parameters of the device under test within a spectral domain from the spectral domain representations for each of the first and second sets of samples;

computing open circuit voltages at the test point within a spectral domain from the characterized transfer parameters of the device under test;

defining a reflection coefficient ($\Gamma_L$) representative of an arbitrary load coupled to the device under test; and computing arbitrary load open circuit voltages within a spectral domain from the characterized transfer parameters of the device under test and the reflection coefficient ($\Gamma_L$);

converting the arbitrary load open circuit voltages from the spectral domain to the time domain;

computing an equalization filter from the computed time domain arbitrary load open circuit voltages and one of the sets of samples in the time domain with the equalization filter adapted to represent the loading of the device under test by the arbitrary load;

acquiring at least an additional set of samples in the time domain of the signal under test from the device under test at the test point via the signal from which the set of samples is used for computing the equalization filter;

processing the additional set of samples using the time domain equalization filter to effect thereby a representation of the arbitrary loading of the device under test.

16. The method of calibrating a signal path of a signal analysis system for processing acquired signal samples using an arbitrary load as recited in claim 15 wherein the acquiring steps further comprise the step of synchronizing the signal under test to a trigger signal.

17. A signal analysis system for processing acquired digital samples of a signal under test from a device under test to represent an arbitrary load on the device under test comprising:

a signal analysis device having a memory for storing transfer parameters associated with the signal analysis device and acquiring time domain digital samples of the signal under test from the device under test via a signal path;

a probe disposed in the signal path providing the signal under test to the signal analysis device from a test point coupled to the device under test, the test probe having associated with it a memory for storing transfer parameters associated with the probe, and at least a first impedance device selectively disposed in the signal path coupled between the test point and the probe with the impedance device having transfer parameters stored in a memory; and a controller having associated memory communicating with the signal analysis device selectively receiving sets of acquired time domain digital samples of the signal under test from the test point via the probe and via at least the first impedance device coupled to the probe and converting the time domain digital samples from the probe and from at least the first impedance device coupled to the probe to spectral representations, and characterizing the transfer parameters of the device under test within a spectral domain from the spectral domain representations of the time domain digital samples from the probe and from at least the first impedance device coupled to the probe, the controller computing arbitrary load open circuit voltages within a spectral domain from the characterized transfer parameters of the device under test and a reflection coefficient ($\Gamma_L$) for the arbitrary load and computing an equalization filter from the arbitrary load open circuit voltages and the spectral domain representation of one of the sets of acquired time domain digital samples such that the controller computes arbitrary load voltages representing the loading of the device under test by the arbitrary load from additional acquired digital samples of the signal under test at the device under test probe point using the equalization filter.

18. The signal analysis system for processing acquired digital samples of a signal under test from a device under test as recited in claim 10 further comprising the signal analysis device receiving a trigger signal synchronous with the signal under test.

* * * * *